(12) United States Patent
Yamaguchi et al.

(10) Patent No.: US 9,391,236 B2
(45) Date of Patent: *Jul. 12, 2016

(54) SUBSTRATE FOR OPTICS HAVING A PLURALITY OF DOT LINES, SEMICONDUCTOR LIGHT EMITTING DEVICE. AND EXPOSURE APPARATUS

(75) Inventors: Fujito Yamaguchi, Tokyo (JP); Jun Koike, Tokyo (JP); Masatoshi Maeda, Tokyo (JP)

(73) Assignee: ASAHI KASEI E-MATERIALS CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/241,837

(22) PCT Filed: Aug. 30, 2012

(86) PCT No.: PCT/JP2012/071998
§ 371 (c)(1),
(2), (4) Date: Apr. 9, 2014

(87) PCT Pub. No.: WO2013/031887
PCT Pub. Date: Mar. 7, 2013

(65) Prior Publication Data
US 2014/0217449 A1     Aug. 7, 2014

(30) Foreign Application Priority Data

| Aug. 31, 2011 | (JP) | 2011-188803 |
| Aug. 31, 2011 | (JP) | 2011-188804 |
| Oct. 18, 2011 | (JP) | 2011-229121 |
| Feb. 10, 2012 | (JP) | 2012-027548 |
| Feb. 10, 2012 | (JP) | 2012-027549 |
| Feb. 10, 2012 | (JP) | 2012-027550 |
| Apr. 10, 2012 | (JP) | 2012-089230 |

(51) Int. Cl.
| *H01L 33/22* | (2010.01) |
| *H01L 51/52* | (2006.01) |
| *G03F 7/00* | (2006.01) |
| *G03F 7/24* | (2006.01) |
| *B29C 43/46* | (2006.01) |
| *G03F 7/20* | (2006.01) |
| *B82Y 10/00* | (2011.01) |
| *B82Y 40/00* | (2011.01) |
| *H01L 33/00* | (2010.01) |
| *H01L 21/02* | (2006.01) |

(52) U.S. Cl.
CPC ............... *H01L 33/22* (2013.01); *B29C 43/46* (2013.01); *B82Y 10/00* (2013.01); *B82Y 40/00* (2013.01); *G03F 7/0002* (2013.01); *G03F 7/2006* (2013.01); *G03F 7/24* (2013.01); *B29C 2043/464* (2013.01); *H01L 21/0237* (2013.01); *H01L 21/0243* (2013.01); *H01L 21/0254* (2013.01); *H01L 21/02458* (2013.01); *H01L 21/02658* (2013.01); *H01L 33/007* (2013.01); *H01L 51/5268* (2013.01); *Y10T 428/24479* (2015.01)

(58) Field of Classification Search
CPC ......................... H01L 33/22; H01L 51/5268
See application file for complete search history.

(56) References Cited

U.S. PATENT DOCUMENTS

| 6,870,191 | B2 | 3/2005 | Niki et al. | |
| 7,060,587 | B2* | 6/2006 | Bearda et al. | 438/409 |
| 8,110,484 | B1* | 2/2012 | Sato | C30B 25/04 |
| | | | | 257/E21.113 |
| 8,226,837 | B2* | 7/2012 | Kurihara et al. | 216/24 |
| 8,328,371 | B2* | 12/2012 | Taniguchi | 359/601 |
| 8,928,106 | B2* | 1/2015 | Kajiya et al. | 257/459 |
| 2004/0239844 | A1* | 12/2004 | Kanoh | G02B 5/10 |
| | | | | 349/113 |
| 2007/0246700 | A1 | 10/2007 | Park | |
| 2008/0145522 | A1* | 6/2008 | Itoh | B82Y 10/00 |
| | | | | 427/129 |
| 2008/0304155 | A1* | 12/2008 | Endoh | G02B 1/118 |
| | | | | 359/558 |
| 2008/0305969 | A1* | 12/2008 | Dijksman | B01J 19/0046 |
| | | | | 506/30 |
| 2009/0015142 | A1 | 1/2009 | Potts et al. | |

| | | | |
|---|---|---|---|
| 2009/0046362 | A1 | 2/2009 | Guo et al. |
| 2010/0078552 | A1* | 4/2010 | Ikeda .................. H01J 49/0418 |
| | | | 250/283 |
| 2010/0136792 | A1* | 6/2010 | Mebarki ............. H01L 21/0337 |
| | | | 438/703 |
| 2010/0297789 | A1 | 11/2010 | Hiratsuka |
| 2010/0297795 | A1 | 11/2010 | Ishihara |
| 2011/0012109 | A1* | 1/2011 | Kryliouk et al. ................ 257/49 |
| 2011/0297966 | A1 | 12/2011 | Zhu et al. |
| 2012/0012874 | A1* | 1/2012 | Morioka et al. ............... 257/98 |
| 2012/0032306 | A1 | 2/2012 | Baur et al. |
| 2012/0062726 | A1* | 3/2012 | Hsieh .................... G06F 9/7065 |
| | | | 348/87 |
| 2012/0138985 | A1* | 6/2012 | Ono et al. ....................... 257/98 |
| 2013/0011611 | A1* | 1/2013 | Taguchi et al. ............... 428/142 |
| 2014/0326988 | A1* | 11/2014 | Yamaguchi et al. ........... 257/40 |

FOREIGN PATENT DOCUMENTS

| | | |
|---|---|---|
| CN | 101859856 A | 10/2010 |
| CN | 102157643 A | 8/2011 |
| DE | 103 06 779 A1 | 7/2004 |
| DE | 10 2006 024 423 A1 | 8/2007 |
| DE | 10 2009 018 286 A1 | 10/2010 |
| EP | 2 690 650 A1 | 1/2014 |
| EP | 2 799 915 A1 | 11/2014 |
| EP | 2 835 836 A1 | 2/2015 |
| JP | 2003-318441 A | 11/2003 |
| JP | 2005-11465 A | 1/2005 |
| JP | 2005-259970 A | 9/2005 |
| JP | 2006269163 A * | 10/2006 |
| JP | 2007-294972 A | 11/2007 |
| JP | 2010-92936 A | 4/2010 |
| JP | 2010-144120 A | 7/2010 |
| JP | 2011-118049 A | 6/2011 |
| JP | 2011-222421 A | 11/2011 |
| JP | 2011255603 A * | 12/2011 |
| JP | 2012-160502 A | 8/2012 |
| WO | WO 2012/116887 A1 | 9/2012 |

OTHER PUBLICATIONS

Choi et al. "OSNR Monitoring Technique for DPSK/DQPSK Signals Based on Self-Heterodyne Detection", IEEE photo. Tech. Lett., vol. 20, No. 13 (2008).

Gao et al. "Enhancement of the light output power of InGaN/GaN light-emitting diodes grown on pyramidal patterned sapphire substrates in the micro-and nanoscale", J. Appl. Phys. 103, 014314 (2008).

International Search Report, issued in PCT/JP2012/071998, dated Oct. 30, 2012.

European Search Report, dated Mar. 17, 2015, for corresponding European Application No. 14 19 3828.

European Search Report, dated Mar. 17, 2015, for corresponding European Application No. 14 19 3830.

European Search Report, dated Mar. 17, 2015, for corresponding European Application No. 14 19 3833.

Supplementary European Search Report, dated Jun. 12, 2014, for corresponding European Application No. 12 82 8469.

Windisch et al., "40% Efficient Thin-Film Surface-Textured Light-Emitting Diodes by Optimization of Natural Lithography," IEEE Transactions on Electron Devices, vol. 47, No. 7. Jul. 2000, XP11017321A, pp. 1492-1498.

* cited by examiner

*Primary Examiner* — Ida M Soward

(74) *Attorney, Agent, or Firm* — Birch, Stewart, Kolasch & Birch, LLP

(57) ABSTRACT

To provide a substrate for optics provided with a fine-structure product which improves luminous efficiency of an LED while improving internal quantum efficiency IQE by decreasing the number of dislocation defects in a semiconductor layer, a substrate for optics (1) is provided with a fine-structure layer (12) including dots comprised of a plurality of convex portions (13) extending in the direction of from the main surface of a substrate (11) to outside the surface, where the fine-structure layer (12) has a plurality of dot lines (13-1 to 13-N) in which a plurality of dots is arranged with a pitch Py in the first direction in the main surface of the substrate (11), while having the plurality of dot lines in which a plurality of dots is arranged with a pitch Px in the second direction orthogonal to the first direction in the main surface of the substrate (11), one of the pitch Py and the pitch Px is a constant interval of nano-order, while the other one is an inconstant interval of nano-order, or both are inconstant intervals of nano-order.

10 Claims, 23 Drawing Sheets

Z-PHASE SIGNAL

REFERENCE PULSE SIGNAL

MODULATED PULSE SIGNAL

SUBSTRATE FOR OPTICS HAVING A PLURALITY OF DOT LINES, SEMICONDUCTOR LIGHT EMITTING DEVICE. AND EXPOSURE APPARATUS

TECHNICAL FIELD

The present invention relates to a substrate for optics and semiconductor light emitting device, and more particularly, to a substrate for optics with a fine structure formed on the surface thereof, semiconductor light emitting device using the substrate, nano-imprint mold applicable to the substrate and device, and an exposure apparatus to prepare the mold.

BACKGROUND ART

A GaN-based semiconductor device typified by a blue LED is manufactured by layering an n layer, light emitting layer and p layer on a single crystal substrate by epitaxial growth, and as the substrate, a sapphire single crystal substrate and SiC single crystal substrate are generally used. However, for example, since lattice mismatch exists between a sapphire crystal and a GaN-based semiconductor crystal, dislocations occur due to the lattice mismatch (for example, see Non-patent Document 1). The dislocation density reaches $1 \times 10^9/cm^2$. By the dislocations, internal quantum efficiency decreases inside the LED, and as a result, luminous efficiency of the LED decreases.

Further, since the refractive index of the GaN-based semiconductor layer is larger than that of the sapphire substrate, light generated in the semiconductor light emitting layer is not emitted at angles of the critical angle or more from an interface with the sapphire substrate, the light becomes waveguide mode and is attenuated, and there is a problem that external quantum efficiency decreases as a result. Meanwhile, in the case of using the SiC substrate such that the refractive index is extremely larger than that of an air layer as the single crystal substrate, light is not emitted at angles of the critical angle or more from an interface between the SiC substrate and the air layer. Therefore, as in the case of using the sapphire substrate, emitted light generated in the semiconductor light emitting layer becomes waveguide mode and is attenuated, and there is a problem that external quantum efficiency decreases.

Therefore, such a technique is proposed that a substrate is provided with concavities and convexities that do not develop defects in the semiconductor to change the light waveguide direction of light in the semiconductor layer and that external quantum efficiency is thereby increased (for example, see Patent Document 1).

Further, another technique for a sapphire substrate is proposed in which the size of the concavo-convex structure provided on the substrate is nano-size and a pattern of the concavo-convex structure is of a random arraignment (for example, see patent Document 2). In addition, it is reported that when the pattern size provided on the substrate is nano-size, luminous efficiency of an LED is increased as compared with a pattern substrate of micro-size (for example, see Non-patent Document 2). Moreover, a GaN-based semiconductor device is proposed in which a concavo-convex structure is provided on the upper surface of a p-type semiconductor layer to reduce contact resistance with a transparent conductive film (for example, see Patent Document 3).

PRIOR ART DOCUMENT

Patent Document

[Patent Document 1] Japanese Unexamined Patent Publication No. 2003-318441

[Patent Document 2] Japanese Unexamined Patent Publication No. 2007-294972

[Patent Document 3] Japanese Unexamined Patent Publication No. 2005-259970

Non-Patent Document

[Non-patent Document 1] IEEE photo. Tech. Lett., 20, 13 (2008)

[Non-patent Document 2] J. Appl. Phys., 103, 014314 (2008)

DISCLOSURE OF INVENTION

Problems to be Solved by the Invention

As factors to determine external quantum efficiency EQE indicative of luminous efficiency of an LED, there are electron injection efficiency EIE, internal quantum efficiency IQE, and light extraction efficiency LEE. Among the factors, internal quantum efficiency IQE is dependent on the dislocation density caused by crystal mismatch of the GaN-based semiconductor crystal. Light extraction efficiency LEE is improved by disturbing the waveguide mode inside the GaN-based semiconductor crystal layer by light scattering due to the concavo-convex structure provided on the substrate. Further, electron injection efficiency EIE is improved by reducing interface resistance between a p-type semiconductor layer and a transparent conductive film comprised of oxide such as ITO, ZnO, $In_2O_3$, or $SnO_2$. Particularly, since transparent conductive materials such as ITO are n-type conductive materials, the Schottky barrier tends to form in the interface with the p-type semiconductor layer, the ohmic property thereby decreases, and contact resistance tends to increase. Therefore, the concavo-convex structure is formed in the interface with the p-type semiconductor layer to increase the contact area, and ohmic contact is enhanced to improve.

In other words, as the roles (effects) of the concavo-convex structure in a semiconductor light emitting device, there are (1) improvements in internal quantum efficiency IQE by decreasing dislocations inside the semiconductor crystal, (2) improvements in light extraction efficiency LEE by resolving the waveguide mode, and (3) improvements in electron injection efficiency EIE by enhancement of ohmic contact.

However, in the technique as described in Patent Document 1, improvements of light extraction efficiency LEE due to the effect of (2) are made, but the effect (1) of decreasing dislocations is a little. The reason why dislocation defects decrease by providing concavities and convexities on the substrate surface is that a CVD growth mode of the GaN-based semiconductor layer is disturbed by the concavities and convexities, and that the dislocation defects associated with layer growth collide and disappear. Therefore, when concavities and convexities corresponding to the number of defects exist, it is effective in decreasing defects. However, in the number of concavities and convexities less than the number of defects, the effect of decreasing dislocations is limited. For example, in terms of nano-order, the dislocation density of $1 \times 10^9/cm^2$ corresponds to $10/\mu m^2$, and the dislocation density of $1 \times 10^8/cm^2$ corresponds to $1\ \mu m^2$. When about two concavo-convex pieces are provided in $5\ \mu m \times 5/\mu m$ ($\square 5\ \mu m$), the concavo-convex pattern density is $0.08 \times 10^8/cm^2$, and when about two concavo-convex pieces are provided in $500\ nm \times 500\ nm$ ($\square 500\ nm$), the concavo-convex pattern density is $8 \times 10^8/cm^2$. Thus, when the concavo-convex size is made a pitch of nano-order, there is a significant effect in decreasing the dislocation density.

However, when the concavo-convex pattern density is fine, the scattering effect on light decreases, and the effect (2) of resolving the waveguide mode is reduced. The light emission wavelengths of LEDs are in the visible region, and the light emission wavelengths of GaN-based LEDs particularly used in white LEDs are 450 nm to 500 nm. In order to obtain a sufficient light scattering effect, the concavo-convex pattern is preferably about 2 to 20 times the wavelength, and the effect is a little in nano-order.

Further, in the technique as described in Patent Document 3, it is necessary to make the pitch and depth of the pattern shape the order of nanometers, and improvements in light extraction efficiency by the formed pattern are not adequate. This is because it is necessary to set the thickness of the p-type semiconductor layer at about several hundreds of nanometers due to the value of the absorption coefficient, and the thickness necessarily becomes the same order as the size of the pattern. Meanwhile, the light emission wavelengths of an LED are in the visible light range (450 nm to 750 nm), and in the same pattern as the wavelengths, there is a problem that light extraction efficiency thereof decreases.

Thus, in the conventional techniques, with respect to three effects in LED luminous efficiency i.e. (1) improvements in internal quantum efficiency IQE by decreasing dislocations inside the semiconductor crystal, (2) improvements in light extraction efficiency LEE by resolving the waveguide mode due to light scattering, and (3) improvements in electron injection efficiency EIE by enhancement of ohmic contact, in the roles of the concavo-convex structure in a semiconductor light emitting device, for the size of the concavo-convex pitch, (1) and (3), and (2) are in the tradeoff relationship, and it has not always been said that the optimal structure is obtained. In other words, in the conventional fine-structure products, there is the problem that luminous efficiency of an LED is not sufficiently improved.

The present invention was made in view of such a respect, and it is an object of the invention to provide a substrate for optics provided with a fine-structure product, and semiconductor light emitting device using the substrate which improve luminous efficiency of the LED by improving internal quantum efficiency IQE by decreasing the number of dislocation defects in a semiconductor layer, while resolving the waveguide mode by light scattering to increase light extraction efficiency LEE, or which improve luminous efficiency of the LED by enhancing ohmic contact of a p-type semiconductor layer to increase electron injection efficiency EIE.

Means for Solving the Problem

A substrate for optics of the present invention is characterized by being provided with a fine-structure layer including dots comprised of a plurality of convex portions or concave portions extending in the direction of from a main surface of a substrate to outside the surface, where the fine-structure layer forms a plurality of dot lines in which the plurality of dots is arranged with a pitch Py in the first direction in the main surface of the substrate, while the plurality of dot lines forms a plurality of dot lines arranged with a pitch Px in the second direction orthogonal to the first direction in the main surface of the substrate, and one of the pitch Py and the pitch Px is a constant interval of nano-order, while the other one is an inconstant interval of nano-order, or both are inconstant intervals of nano-order.

In the substrate for optics of the invention, the inconstant interval of nano-order preferably has a variable width $\delta$.

In the substrate for optics of the invention, it is preferable that the pitch Py with the inconstant interval is equal to a distance between centers of respective dots, the pitch Px with the inconstant interval is equal to a distance among a plurality of dot lines that the plurality of dots is arranged with the pitch Py, the pitch Py and the pitch Px are larger than a diameter of each dot, pitches Pyn among at least four or more and m or less of adjacent dots ($3 \leq n \leq 2a$ or $3 \leq n \leq 2a+1$. In addition, m and a are positive integers and $n=m-1$.) meet the relationship of following equation (1) while at least one or more dot groups formed with the pitches Py1 to Pyn are arranged in the first direction when the pitch Py is the inconstant interval, and that when the pitch Px is the inconstant interval, pitches Pxn among at least four or more and m or less of adjacent dots ($3 \leq n \leq 2a$ or $3 \leq n \leq 2a+1$. In addition, m and a are positive integers and $n=m-1$.) meet the relationship of following equation (2) while at least one or more dot line groups formed with the pitches Px1 to Pxn are arranged in the second direction.

$$Py1<Py2<Py3<\ldots<Pya>\ldots>Pyn \quad (1)$$

$$Px1<Px2<Px3<\ldots<Pxa>\ldots>Pxn \quad (2)$$

Further, in the substrate for optics of the invention, it is preferable that the pitch Py with the inconstant interval is equal to a distance between centers of respective dots, the pitch Px with the inconstant interval is equal to a distance among a plurality of dot lines that the plurality of dots is arranged with the pitch Py, the pitch Py and the pitch Px are larger than a diameter of each dot, pitches Pyn among at least four or more and m or less of adjacent dots ($3 \leq n \leq 2a$ or $3 \leq n \leq 2a+1$. In addition, m and a are positive integers and $n=m-1$.) meet the relationship of above-mentioned equation (1) while dot groups formed with the pitches Py1 to Pyn are formed by repeatedly arranging a long-period unit Lyz in the first direction when the pitch Py is the inconstant interval, and that when the pitch Px is the inconstant interval, pitches Pxn among at least four or more and m or less of adjacent dots ($3 \leq n \leq 2a$ or $3 \leq n \leq 2a+1$. In addition, m and a are positive integers and $n=m-1$.) meet the relationship of above-mentioned equation (2) while dot line groups formed with the pitches Px1 to Pxn are formed by repeatedly arranging a long-period unit Lxz in the second direction.

Furthermore, in the substrate for optics of the invention, it is preferable that the diameter of each of the dots increases or decreases corresponding to the pitch Py and/or the pitch Px, dot diameters Dyn of at least four or more and m or less of adjacent dots ($3 \leq n \leq 2a$ or $3 \leq n \leq 2a+1$. In addition, m and a are positive integers and $n=m-1$.) forming the pitch meet the relationship of following equation (3) while at least one or more dot groups formed with the dot diameters Dy1 to Dyn are arranged in the first direction when the pitch Py is the inconstant interval, and that when the pitch Px is the inconstant interval, dot diameters Dxn of at least four or more and m or less of adjacent dots ($3 \leq n \leq 2a$ or $3 \leq n \leq 2a+1$. In addition, m and a are positive integers and $n=m-1$.) forming the pitch meet the relationship of following equation (4) while at least one or more dot groups formed with the dot diameters Dx1 to Dxn are arranged in the second direction.

$$Dy1<Dy2<Dy3<\ldots<Dya>\ldots>Dyn \quad (3)$$

$$Dx1<Dx2<Dx3<\ldots<Dxa>\ldots>Dxn \quad (4)$$

Still furthermore, in the substrate for optics of the invention, it is preferable that the diameter of each of the dots increases or decreases corresponding to the pitch Py and/or the pitch Px, dot diameters Dyn of at least four or more and m or less of adjacent dots ($3 \leq n \leq 2a$ or $3 \leq n \leq 2a+1$. In addition, m and a are positive integers and n=m−1.) forming the pitch meet the relationship of above-mentioned equation (3) while dot groups formed with the dot diameters Dy1 to Dyn are repeatedly arranged in a long-period unit Lyz in the first direction when the pitch Py is the inconstant interval, and that when the pitch Px is the inconstant interval, dot diameters Dxn of at least four or more and m or less of adjacent dots (3≤n≤2a or 3≤n≤2a+1. In addition, m and a are positive integers and n=m−1.) forming the pitch meet the relationship of above-mentioned equation (4) while dot groups formed with the dot diameters Dx1 to Dxn are repeatedly arranged in a long-period unit Lxz in the second direction.

Moreover, in the substrate for optics of the invention, it is preferable that the height of each of the dots increases or decreases corresponding to the pitch Py and/or the pitch Px, dot heights Hyn of at least four or more and m or less of adjacent dots (3≤n≤2a or 3≤n≤2a+1. In addition, m and a are positive integers and n=m−1.) forming the pitch meet the relationship of following equation (5) while at least one or more dot groups formed with the dot heights Hy1 to Hyn are arranged in the first direction when the pitch Py is the inconstant interval, and that when the pitch Px is the inconstant interval, dot heights Hxn of at least four or more and m or less of adjacent dots (3≤n≤2a or 3≤n≤2a+1. In addition, m and a are positive integers and n=m−1.) forming the pitch meet the relationship of following equation (6) while at least one or more dot groups formed with the dot heights Hx1 to Hxn are arranged in the second direction.

$$Hy1<Hy2<Hy3<\ldots<Hya>\ldots>Hyn \quad (5)$$

$$Hx1<Hx2<Hx3<\ldots<Hxa>\ldots>Hxn \quad (6)$$

Further, in the substrate for optics of the invention, it is preferable that the height of each of the dots increases or decreases corresponding to the pitch Py and/or the pitch Px, dot heights Hyn of at least four or more and m or less of adjacent dots (3≤n≤2a or 3≤n≤2a+1. In addition, m and a are positive integers and n=m−1.) forming the pitch meet the relationship of above-mentioned equation (5) while dot groups formed with the dot heights Hy1 to Hyn are repeatedly arranged in a long-period unit Lyz in the first direction when the pitch Py is the inconstant interval, and that when the pitch Px is the inconstant interval, dot heights Hxn of at least four or more and m or less of adjacent dots (3≤n≤2a or 3≤n≤2a+1. In addition, m and a are positive integers and n=m−1.) forming the pitch meet the relationship of above-mentioned equation (6) while dot groups formed with the dot heights Hx1 to Hxn are repeatedly arranged in a long-period unit Lxz in the second direction.

Furthermore, a substrate for optics of the invention is characterized by being provided with a fine-structure layer including a plurality of dots comprised of a plurality of convex portions or concave portions extending in the direction of from a main surface of a substrate to outside the surface, where the fine-structure layer forms dot lines such that the plurality of dots is arranged at constant intervals Py in the first direction in the main surface of the substrate, the dot lines are provided parallel with the pitch Px of a constant interval in the second direction orthogonal to the first direction, and a shift amount α1 in the first direction between adjacent first dot line and second dot line is different from a shift amount α2 in the first direction between the second dot line and a third dot line adjacent to the second dot line.

In this case, it is preferable that a difference between the shift amount α1 and the shift amount α2 is not constant.

In the substrate for optics of the invention as described above, it is preferable that each of the pitch Py and the pitch Px ranges from 100 nm to 1,000 nm.

Further, a semiconductor light emitting device of the invention is characterized by including at least one or more substrates for optic of the invention as described previously in a configuration.

A mold for imprint of the invention is a mold for imprint to manufacture the substrate for optics of the invention as described previously by transfer forming, and is characterized by having a shape fitted with the dots disposed on the main surface of the substrate for optics.

An exposure apparatus of the invention is an exposure apparatus which pulse-exposes a surface of a roll-shaped member coated with a resist layer, to laser light, with a dot pattern corresponding to a dot pattern disposed on a surface of a mold for imprint to manufacture the substrate for optics of the invention as described previously by transfer forming, and forms an exposed pattern comprised of a plurality of exposed portions on the resist layer, and is characterized by being provided with a rotation control section that rotates the roll-shaped member on the center axis, a processing head portion that applies the laser light, axis-direction shift means for shifting the processing head portion along the long-axis direction of the roll-shaped member, and an exposure control section which repeats pulse exposure based on a pulse signal phase-modulated based on a reference signal synchronized with rotation of the rotation control section, and controls the processing head portion so as to form the exposed pattern along the circumference of the roll-shaped member.

The exposure apparatus of the invention is preferably provided with the axis-direction shift means for shifting the processing head portion along the long-axis direction of the roll-shaped member at a shift velocity varying periodically and/or the exposure control section which repeats pulse exposure based on a pulse signal controlled based on a reference signal synchronized with rotation of the rotation control section, and controls the processing head portion so as to form the exposed pattern along the circumference of the roll-shaped member.

In the exposure apparatus of the invention, is preferable that at least one of a length and an interval of the exposed pattern formed along the circumference of the roll-shaped member is controlled by a plurality of pulse lengths with respect to the pulse signal.

In the exposure apparatus of the invention, it is preferable that a pitch and a size of the exposed pattern formed along the circumference of the roll-shaped member range from 50 nm to 1 μm.

In the exposure apparatus of the invention, it is preferable that the resist layer to coat the surface of the roll-shaped member is comprised of a heat-reactive resist.

In the exposure apparatus of the invention, it is preferable that a wavelength of the laser light is 550 nm or less.

In the exposure apparatus of the invention, it is preferable that the laser light is focused with an objective lens, and is automatically focused so that the surface of the roll-shape member exists inside a focus depth.

In the exposure apparatus of the invention, it is preferable that a laser used in the processing head portion is a semiconductor laser.

In the exposure apparatus of the invention, it is preferable that a laser used in the processing head portion is an excimer laser of one of XeF, XeCl, KrF, ArF, and F2.

In the exposure apparatus of the invention, it is preferable that a laser used in the processing head portion is one of a second harmonic, third harmonic and fourth harmonic of a Nd:YAG laser.

Advantageous Effect of the Invention

According to the present invention, by the fine-structure layer provided in the substrate for optics and semiconductor light emitting device, by improving internal quantum efficiency IQE by decreasing the number of dislocation defects in the semiconductor layer, or enhancing ohmic contact of the p-type semiconductor layer to improve electron injection efficiency EIE, and resolving the waveguide mode by light scattering to increase light extraction efficiency LEE, it is possible to enhance luminous efficiency of the LED.

BEST MODE FOR CARRYING OUT THE INVENTION

Figure 1:
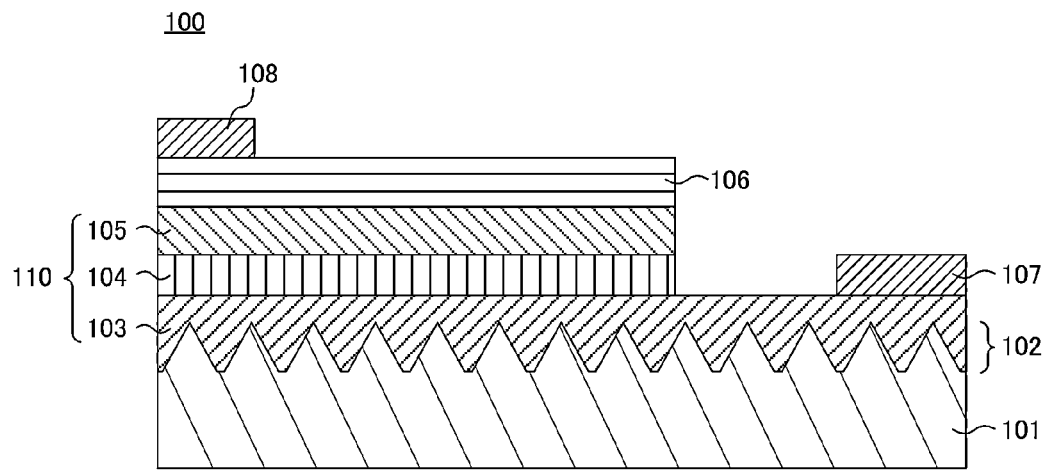
FIG. 1 is a cross-sectional schematic diagram of a semiconductor light emitting device to which is applied a substrate for optics of this Embodiment.

Embodiments of the present invention will specifically be described below.

A substrate for optics according to this Embodiment is characterized by being provided with a fine-structure layer including dots comprised of a plurality of convex portions or concave portions extending in the direction of from the main surface of a substrate to outside the surface, where the fine-structure layer forms a plurality of dot lines in which the plurality of dots is arranged with a pitch Py in the first direction in the main surface of the substrate, while the plurality of dot lines forms a plurality of dot lines arranged with a pitch Px in the second direction orthogonal to the first direction in the main surface of the substrate, and one of the pitch Py and the pitch Px is a constant interval of nano-order, while the other one is an inconstant interval of nano-order, or both are inconstant intervals of nano-order.

According to this configuration, since the concavo-convex structure of nano-order is provided on the surface of the substrate for optics, the CVD growth mode of a semiconductor layer is disturbed in providing the semiconductor layer on the surface of the substrate for optics, dislocation defects associated with phase growth collide to disappear, and it is possible to produce an effect of reducing dislocation defects. Since the dislocation defects inside the semiconductor crystal are reduced, it is possible to enhance internal quantum efficiency IQE of the semiconductor light emitting device.

Further, since the substrate for optics having concavities and convexities of nano-order is provided on the uppermost surface of the semiconductor light emitting device having a layered semiconductor layer formed by layering at least two or more semiconductor layers and a light emitting layer, the contact area with a transparent conductive film or electrode pad formed on the surface is increased, and it is possible to reduce contact resistance.

Furthermore, since both the pitch Py and the pitch Px or either one is an inconstant interval, periodicity of nano-order is disturbed in the concavities and convexities provided on the surface of the substrate for optics, and it is thereby possible to strongly develop the light scattering property with respect to emitted light from the semiconductor layer. The waveguide mode is resolved by the light scattering property, and it is possible to enhance light extraction efficiency LEE.

In the case where one of the pitch Py and the pitch Px is a constant interval and the other one is an inconstant interval, as compared with the case where both the pitch Py and the pitch Px are inconstant intervals, the concavo-convex interval of nano-order is decreased. By this means, the light scattering effect by disturbance of periodicity decreases, but increases the effect of reducing dislocation defects due to the CVD growth mode or the contact area with the transparent conductive film or electrode pad, and it is possible to more enhance the effect of reducing contact resistance.

Meanwhile, in the case where both the pitch Py and the pitch Px are inconstant intervals, decreases the effect of reducing dislocation defects due to the CVD growth mode or the effect of reducing contact resistance, but it is possible to more enhance the light scattering effect due to disturbance of periodicity.

With respect to whether to make both the pitch Py and the pitch Px inconstant intervals or one of the pitch Py and the pitch Px an inconstant interval, by selecting various manners corresponding to the surface state of the substrate for optics and the purpose, it is possible to select an optimal structure. For example, in selecting dislocation defects or light scattering effect, in the case of a substrate for optics, CVD apparatus or CVD conditions such that dislocation defects are relatively hard to occur, in order to increase the light scattering effect, the structure may be adopted to make both the pitch Py and the pitch Px inconstant intervals. Meanwhile, in the case of a substrate for optics, CVD apparatus or CVD conditions that tend to develop relatively more dislocation defects, in order to increase the effect of reducing dislocation defects, the structure may be adopted to make one of the pitch Py and the pitch Px an inconstant interval.

Further, in selecting contact resistance or light scattering effect, by selecting various manners corresponding to generation conditions and types of the transparent conductive film or the electrode pad, and the uppermost-layer semiconductor layer, it is possible to select an optimal structure. For example, in the case of a combination of a p-type semiconductor layer and transparent conductive film with relatively good ohmic characteristics, in order to increase the light scattering effect, the structure may be adopted to make both the pitch Px and the pitch Py inconstant intervals. Meanwhile, conversely, in the case where ohmic characteristics are not good, in order to increase the effect of reducing contact resistance by increases in the contact area, the structure may be adopted to make one of the pitch Py and the pitch Px an inconstant interval.

The substrate for optics according to this Embodiment will specifically be described below. The substrate for optics is a substrate adjoining to a semiconductor light emitting device, and is the substrate adjoining to one of an n-type semiconductor layer, light emitting semiconductor layer and p-type semiconductor layer of the semiconductor light emitting device comprised of at least one or more n-type semiconductor layers, at least one or more p-type semiconductor layers and one or more light emitting layers.

For example, FIG. 1 is a cross-sectional schematic diagram of a semiconductor light emitting device to which is applied a substrate for optics of this Embodiment. As shown in FIG. 1, in a semiconductor light emitting device 100, an n-type semiconductor layer 103, light emitting semiconductor layer 104 and p-type semiconductor layer 105 are successively layered on a fine-structure layer 102 provided on one main surface of a substrate for optics 101. Further, a transparent conductive film 106 is formed on the p-type semiconductor layer 105. Furthermore, a cathode electrode 107 is formed on the surface of the n-type semiconductor layer 103, and an anode electrode 108 is formed on the surface of the transparent conductive film 106. In addition, the n-type semiconductor layer 103, light emitting semiconductor layer 104 and p-type semiconductor layer 105 successively layered on the substrate for optics 101 are referred to as a layered semiconductor layer 110.

In addition, in FIG. 1, the semiconductor layers 103, 104 and 105 are successively layered on the fine-structure layer 102 provided on one main surface of the substrate for optics 101, and the semiconductor layers may be successively layered on the other main surface opposed to the surface of the substrate for optics 101 on which the fine-structure layer 102 is provided.

Figure 2:
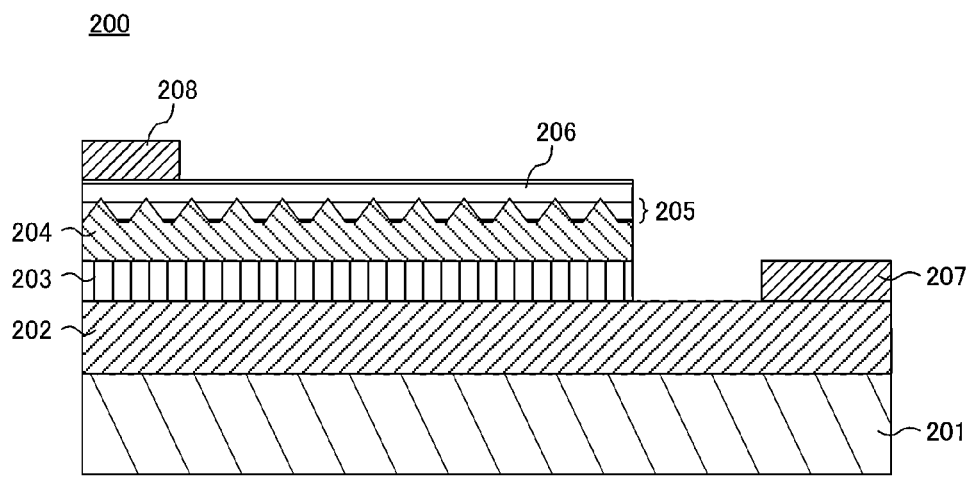
FIG. 2 is another cross-sectional schematic diagram of the semiconductor light emitting device to which is applied the substrate for optics of this Embodiment.

FIG. 2 is a cross-sectional schematic diagram of another example of the semiconductor light emitting device to which is applied the substrate for optics of this Embodiment. As shown in FIG. 2, in a semiconductor light emitting device 200, an n-type semiconductor layer 202, light emitting semiconductor layer 203 and p-type semiconductor layer 204 are successively layered on a substrate for optics 201. Further, on the p-type semiconductor layer 204 is provided a transparent conductive film 206 that is the substrate for optics of this Embodiment having a fine-structure layer 205 on main surface in contact with the p-type semiconductor layer 204. Further, a cathode electrode 207 is formed on the surface of the n-type semiconductor layer 202, and an anode electrode 208 is formed on the surface of the transparent conductive film 206.

In FIG. 2, the main surface provided with the fine-structure layer 205 of the transparent conductive film 206 adjoins to the p-type semiconductor layer 204, and the layer may be provided on the main surface opposed to the p-type semiconductor layer 204.

Figure 3:
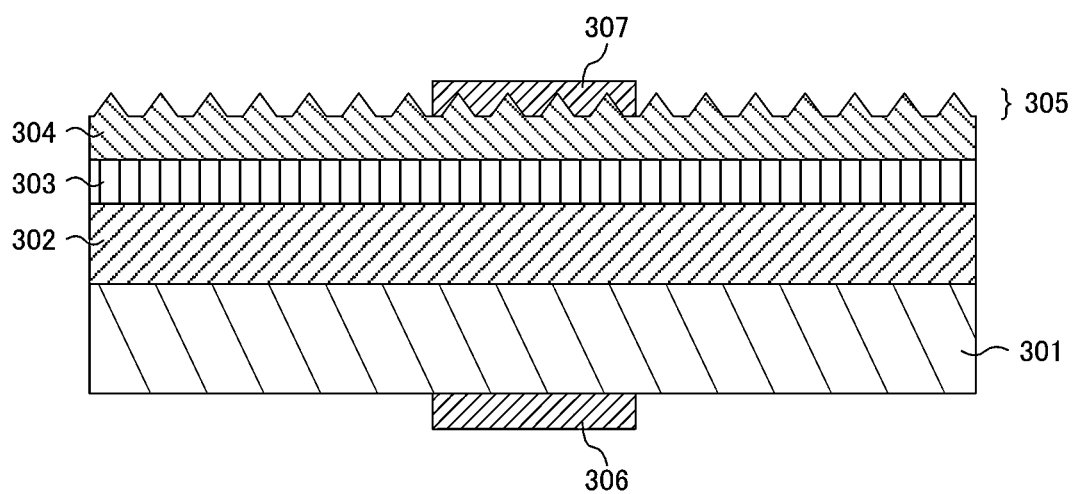
FIG. 3 is still another cross-sectional schematic diagram of the semiconductor light emitting device to which is applied the substrate for optics of this Embodiment.

FIG. 3 is a cross-sectional schematic diagram of still another example of the semiconductor light emitting device to which is applied the substrate for optics of this Embodiment. As shown in FIG. 3, in a semiconductor light emitting device 300, on a substrate for optics 301 are successively layered an n-type semiconductor layer 302, light emitting semiconductor layer 303 and p-type semiconductor layer 304 that is the substrate for optics of the invention where a fine-structure layer 305 is provided on the main surface opposed to the light emitting semiconductor layer 303. A cathode electrode 306 is formed on the main surface on the side opposite to the main surface in contact with the n-type semiconductor layer 302 of the substrate for optics 301, and an anode electrode 307 is formed on the surface of the p-type semiconductor layer 304.

The semiconductor light emitting devices 100, 200 and 300 as shown in FIGS. 1 to 3 are examples of applying the substrate for optics of this Embodiment to the semiconductor light emitting device of double-hetero structure, but the layered structure of the layered semiconductor layer is not limited thereto. Further, a buffer layer not shown may be provided between the substrate and the n-type semiconductor layer.

Figure 4:
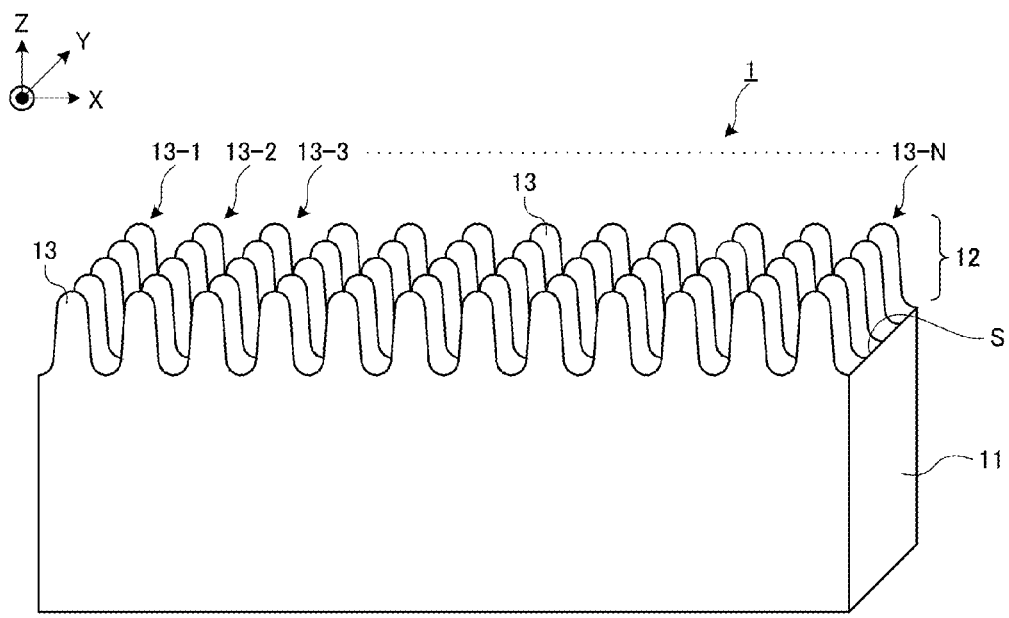
FIG. 4 is a perspective schematic diagram showing an example of a substrate for optics according to Embodiment 1.

A configuration of the substrate for optics according to Embodiment 1 of the present invention will specifically be described below with reference to FIG. 4. FIG. 4 is a perspective schematic diagram showing an example of a substrate for optics 1 according to Embodiment 1. As shown in FIG. 4, the substrate for optics 1 substantially has the shape of a plate, and is provided with a substrate 11, and a fine-structure layer 12 provided on one main surface of the substrate 11. The fine-structure layer 12 includes a plurality of convex portions 13 (convex-portion lines 13-1~13-N) protruding upward from the main surface of the substrate 11. The convex portions 13 are arranged with respective particular intervals.

The fine-structure layer 12 may be formed on the main surface of the substrate 11 separately, or the substrate 11 may be directly processed to form the layer.

Figure 5:
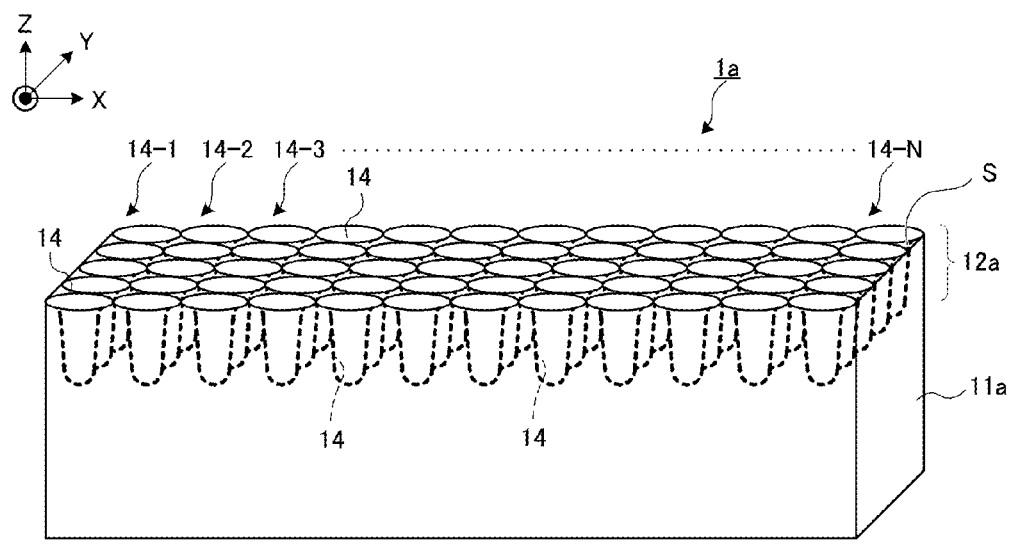
FIG. 5 is a perspective schematic diagram showing another example of the substrate for optics according to Embodiment 1.

In addition, FIG. 4 shows the example in which the fine structure of the fine-structure layer 12 is comprised of a plurality of convex portions 13, but the invention is not limited thereto, and the fine structure of the fine-structure layer 12 may be comprised of a plurality of concave portions. FIG. 5 is a perspective schematic diagram showing another example of the substrate for optics according to Embodiment 1. As shown in FIG. 5, a substrate for optics 1a substantially has the shape of a plate, and is provided with a substrate 11a, and a fine-structure layer 12a provided on one main surface of the substrate 11a. The fine-structure layer 12a includes a plurality of concave portions 14 (concave-portion lines 14-1~14-N) caved in toward the main surface side of the substrate 11a from the surface S of the fine-structure layer 12a. The concave portions 14 are arranged with respective particular intervals.

The fine-structure layer 12a may be formed on the main surface of the substrate 11a separately, or the substrate 11a may be directly processed to form the layer.

Hereinafter, the convex portions 13 or concave portions 14 respectively forming the fine structure of the fine-structure layers 12, 12a in the substrates for optics 1, 1a are referred to as "dots".

Figure 6:
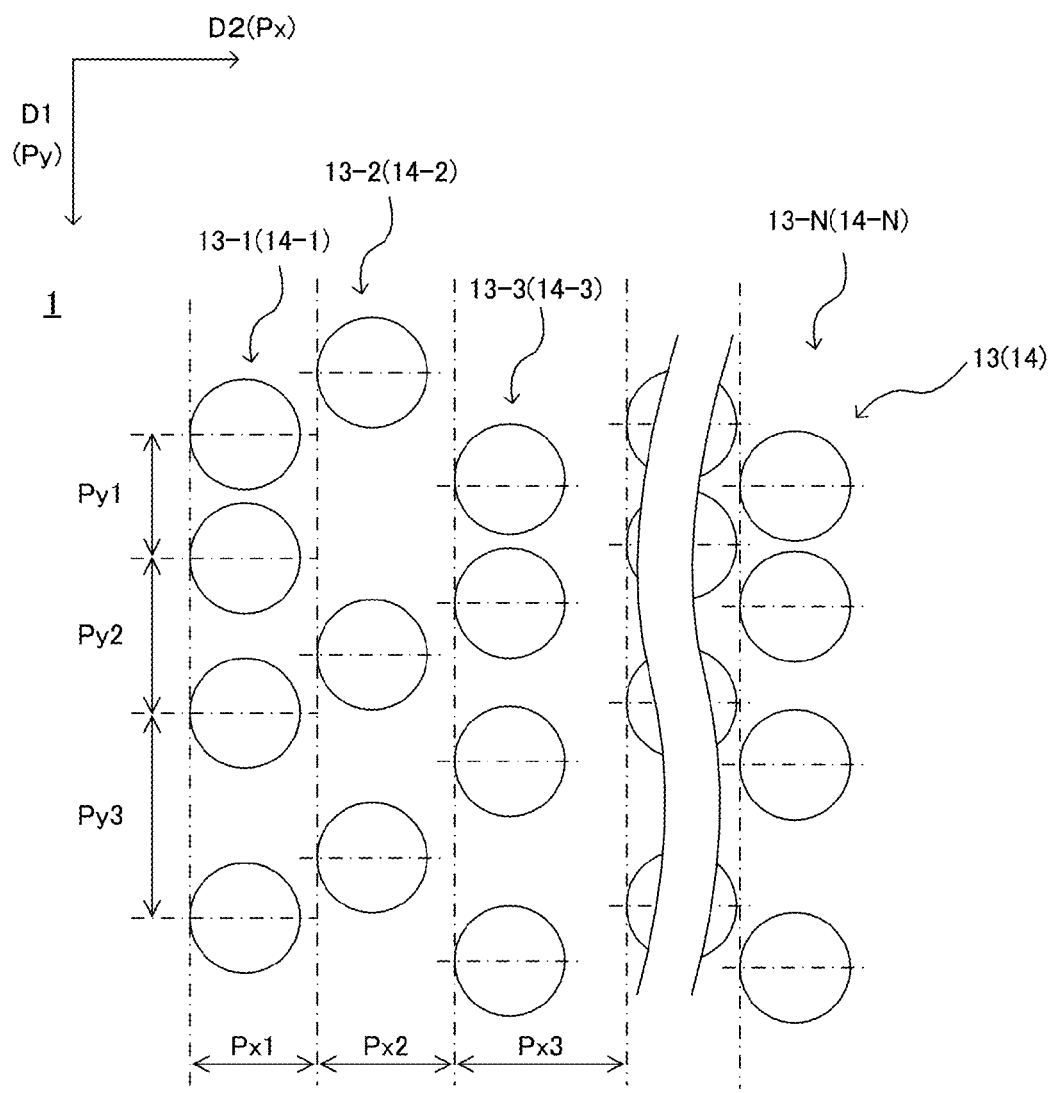
FIG. 6 is a plan schematic diagram of the substrate for optics according to Embodiment 1.

FIG. 6 is a plan schematic diagram of the substrate for optics 1. As shown in FIG. 6, the dots (convex portions 13 or concave portions 14) form a plurality of dot lines (convex-portion lines 13-1~13-N or convex-portion lines 14-1~14-N) in which a plurality of dots is arranged at inconstant intervals Py (pitches Py1, Py2, Py3, . . . ) in a first direction D1 in the main surface of the substrate 11. Further, each dot line is arranged at inconstant intervals (pitches Px1, Px2, Px3, . . . ) in a second direction D2 orthogonal to the first direction D1 in the main surface of the substrate 11.

Moreover, in the substrate for optics of this Embodiment, inconstant intervals of nano-order preferably have a variable width δ. More specifically, in FIG. 6, pitches Py1, Py2, Py3 are in the range of Pyav±δ.

Figure 7:
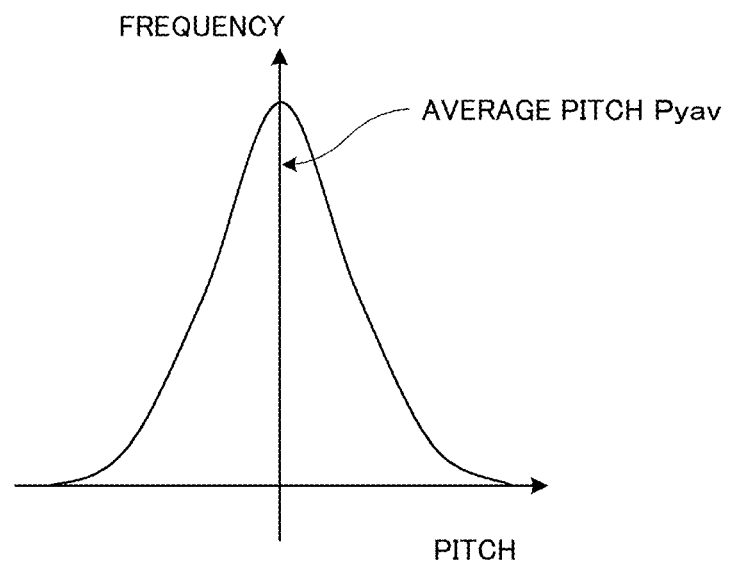
FIG. 7 is a conceptual diagram of an average pitch in the substrate for optics according to Embodiment 1.

FIG. 7 illustrates a conceptual diagram of the average pitch. Herein, the variable width δ is a value three times the standard deviation σ of pitches Py among a plurality of dots forming a dot line 13-1 in the first direction D1, and is defined as a value calculated by measuring the pitch Py in 100 points or more in the first direction D1. Further, the variable width is preferably smaller than the average pitch Pyav. Particularly, when the variable width δ is in the range of 1% to 50% of the average pitch Pyav, the sizes of pitches Py among a plurality of dots forming the dot line 13-1 are in a moderate range, and it is possible to exhibit the effect of reducing dislocation defects due to the CVD growth mode and the effect of reducing contact resistance. Further, when the variable width δ is in the range of 5% to 30% of the average pitch Pyav, it is possible to obtain the effect of reducing dislocation defects due to the CVD growth mode and the effect of reducing contact resistance, and further obtain the light scattering effect, and such a range is preferable.

The above-mentioned description is the description on the pitch Py in the first direction D1, and with respect to the second direction D2, Px is defined by reading Py with Px.

Figure 8:
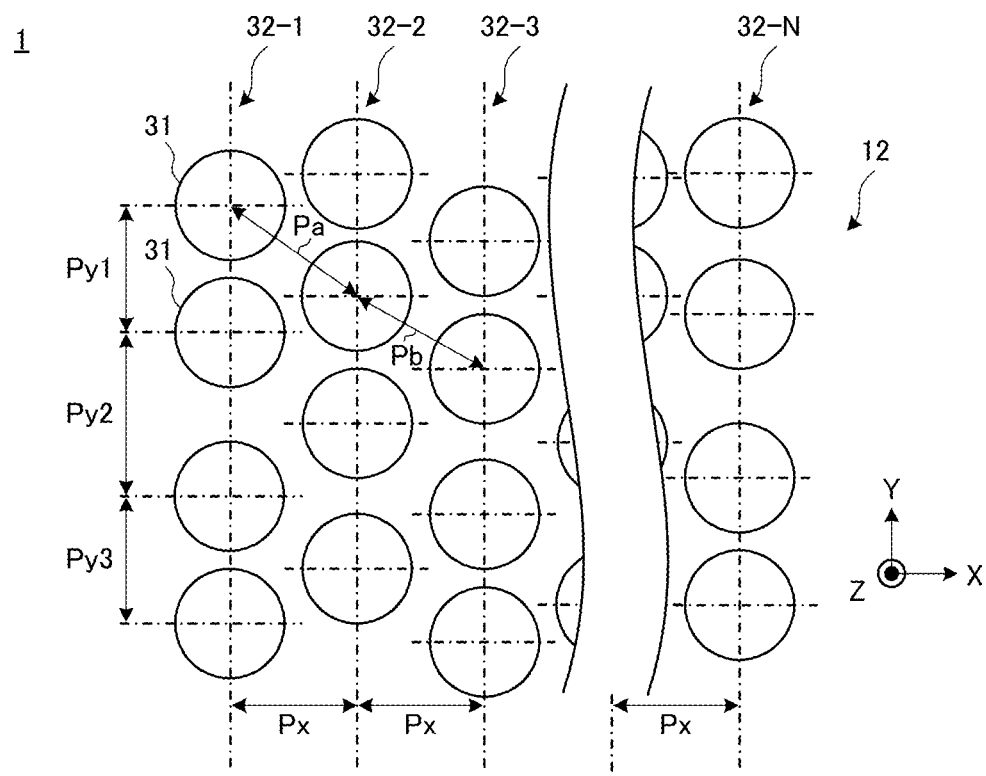
FIG. 8 is another plan schematic diagram of the substrate for optics according to Embodiment 1.

FIG. 8 is another plan schematic diagram of the substrate for optics 1 according to Embodiment 1. As shown in FIG. 8, in the concavo-convex structure 12, a plurality of dot lines 32-1 to 32-N is provided parallel in which a plurality of dots 31 is arranged in the Y-axis direction belonging to the inside of the main surface of the substrate 11 itself. A plurality of dots 31 belonging to each of the dot lines 32-1 to 32-N is arranged at inconstant intervals with mutually different pitches (Py1, Py2, Py3). Further, the dot lines 32-1 to 32-N are provided parallel with a pitch Px of the constant interval in the X-axis direction (second direction) orthogonal to the Y-axis direction in the main surface of the substrate 11 itself.

In other words, in the substrate for optics 1 according to Embodiment 1, a plurality of dots 31 belonging to each of the dot lines 32-1 to 32-N is arranged at inconstant intervals Py1, Py2, Py3 in the Y-axis direction, while the dot lines 32-1 to 32-N are provided at constant intervals in the X-axis direction. By this configuration, in the case of viewing the substrate 11 itself from the X-axis direction, since the plurality of dots 31 mutually deviates and is arranged irregularly on the main surface S, periodicity of the repetition pattern is reduced among the plurality of dots arranged in the main surface S of the substrate 11 itself. For example, pitches Pa and Pb in a slanting direction in the main surface S of the substrate 11 itself are different values. By this means, it is possible to reduce dislocations inside the semiconductor crystal provided on the substrate for optics 1, and it is thereby possible to improve internal quantum efficiency IQE. Further, since the concavo-convex structure is nano-order, it is possible to increase the surface area, and it is possible to decrease contact resistance. Furthermore, since the light scattering property is improved by the concavo-convex structure 12, it is possible to improve light extraction efficiency LEE by resolution of the waveguide mode due to scattering.

Figure 9:
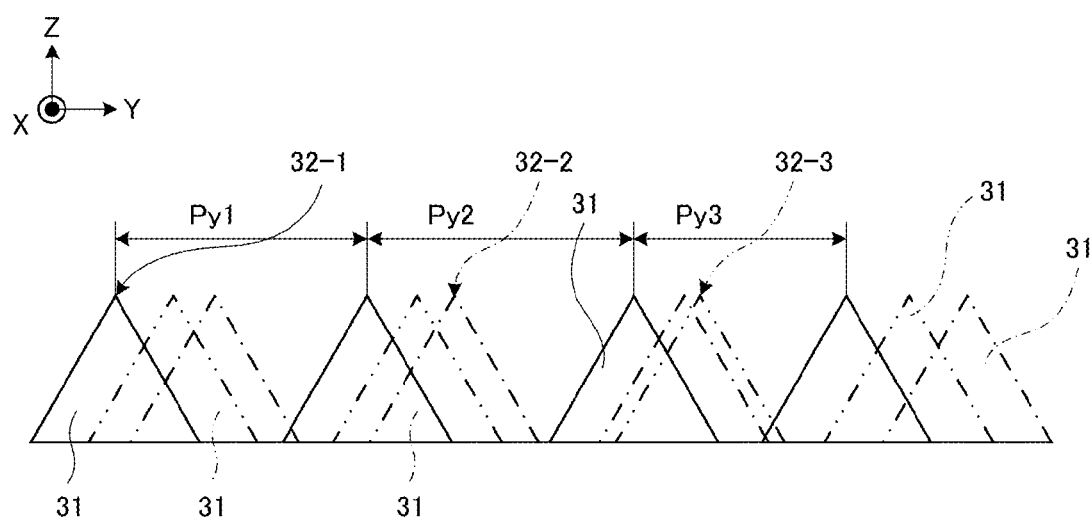
FIG. 9 is a schematic diagram illustrating an arrangement of a plurality of dots of the substrate for optics according to Embodiment 1, viewed from the X-axis direction.

FIG. 9 is a schematic diagram illustrating an arrangement of a plurality of dots, in viewing, from the first direction D1, the substrate for optics 1 of Embodiment 1 in which the plurality of dots has a plurality of dot lines arranged with the pitch Px of the constant interval in the second direction D2, while being arranged with the pitch Py having the variable width δ in the Y-axis direction. In FIG. 9, the plurality of dots 31 is divided into dots belonging to the dot line 32-1 (shown by solid lines in the figure), dots belonging to the dot line 32-2 (shown by one-dot dashed lines in the figure) and dots belonging to the dot line 32-3 (shown by two-dot dashed lines in the figure). A plurality of dots 31 belonging to the same dot line are arranged at inconstant intervals Py1, Py2, Py3 in the Y-axis direction. By this means, a plurality of dots 31 mutually deviates and is arranged irregularly as shown in FIG. 9, the arrangement is disturbed and it is thereby possible to produce the light scattering effect.

Figure 10:
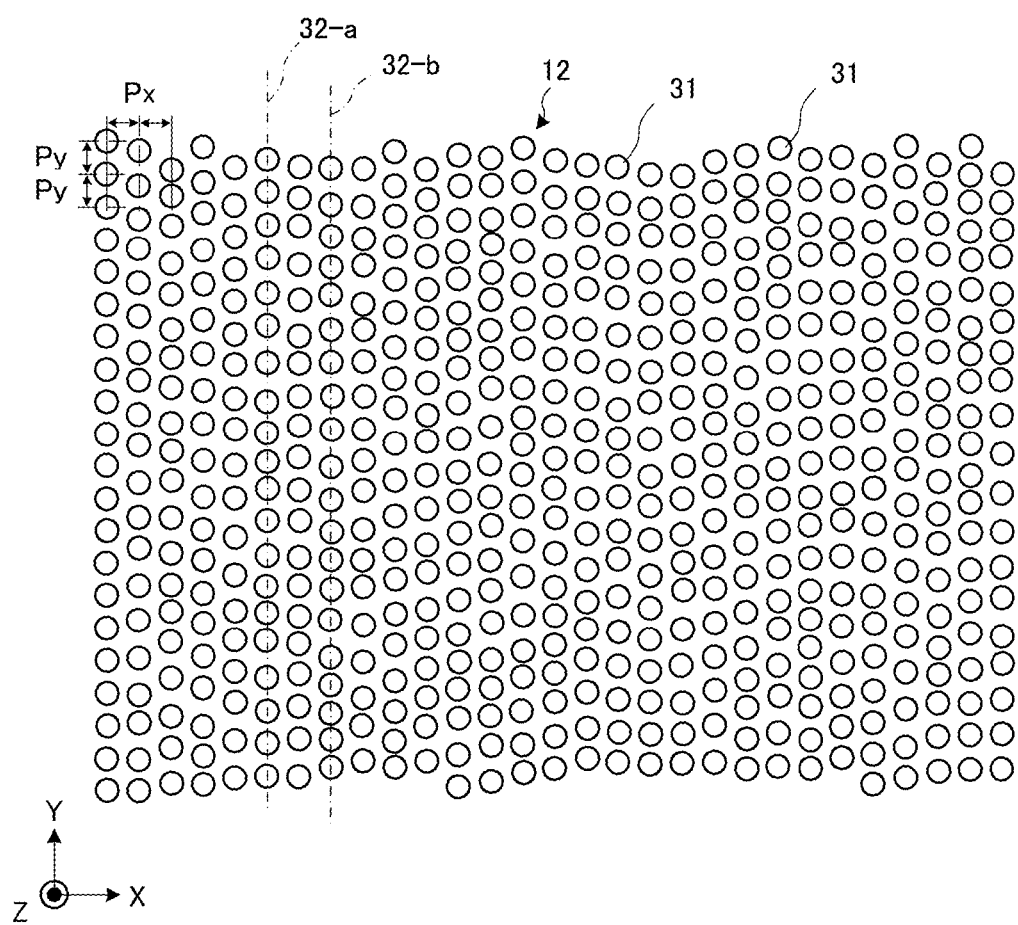
FIG. 10 is a schematic diagram showing an example of an arrangement of a plurality of dots in the substrate for optics according to Embodiment 1.

FIG. 10 is a schematic diagram showing an example of the arrangement (dot pattern) of a plurality of dots 31 constituting the concavo-convex structure 12 in the substrate for optics 1 in Embodiment 1. FIG. 10 shows the example in which the pitch Py and pitch Px of the dots 31 are substantially equal and the variable width δ is 20% of the Pyay. As shown in FIG. 10, also when the dot lines 32-a and 32-b are aligned at constant intervals, that are pitches Px, it is understood that the pitch Py between dots 31 in the Y-axis direction does not have periodicity. Thus, by the existence of a plurality of dots 31, it is possible to suppress dislocation defects inside the semiconductor crystal provided on the substrate for optics 1, and further, by disturbance of the arrangement of a plurality of dots 31, it is possible to produce the light scattering effect.

Figure 11:
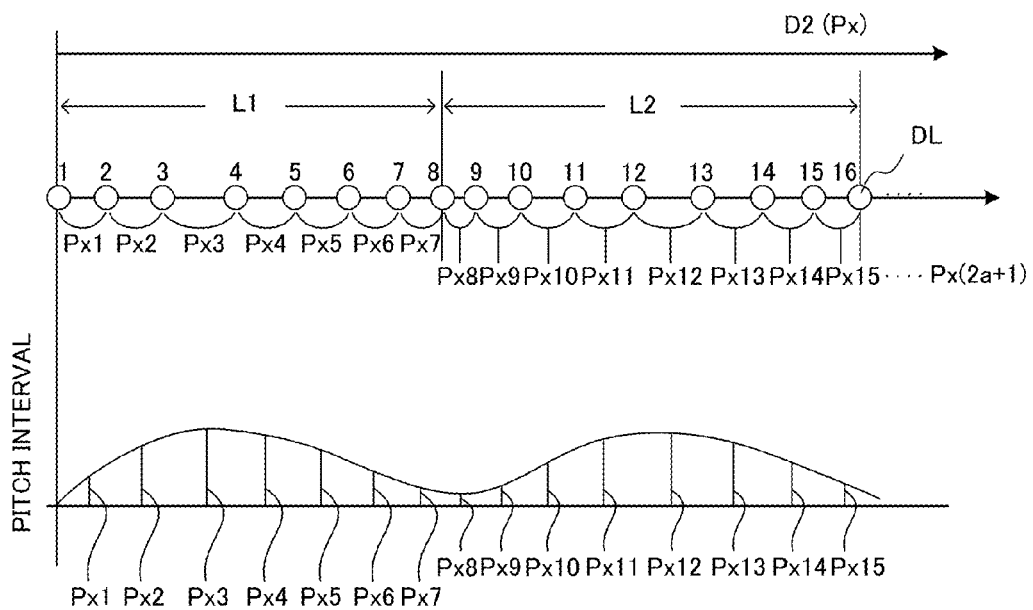
FIG. 11 is a schematic diagram showing an arrangement example of dots in the second direction in the substrate for optics according to Embodiment 1.

Herein, described is an arrangement example of dot lines in the second direction D2 arranged at inconstant intervals with mutually different pitches Px. FIG. 11 is a schematic diagram showing an arrangement example of dot lines in the second direction D2. As shown in FIG. 11, in the dot lines (DL in FIG. 11) in the second direction D2, eight lines are arranged at particular intervals (pitches Px), and eight dot lines are repeatedly arranged. The unit comprised of a plurality (z) of dot lines is referred to as a long-period unit Lxz (in addition, z is a positive integer). In addition, in dots in the first direction D1 that are arranged at inconstant intervals with mutually different pitches Py, by using a long-period unit Lyz, it is possible to arrange the dots in the same manner as in the following description.

The pitch Px is a distance between adjacent dot lines. Herein, the relationship of following equation (1) holds for pitches Pxn among at least four or more and m or less of adjacent dot lines (3≤n≤2a or 3≤n≤2a+1. In addition, m and a are positive integers and n=m−1.) in the long-period unit Lxz.

$$Px1 < Px2 < Px3 < \ldots < Pxa > \ldots > Pxn \quad (1)$$

In addition, the diameter of each dot is smaller than the pitch Pxn. The length of from the pitch Px1 to Pxn constitutes the long-period unit Lxz.

FIG. 11 shows the case where the long-period unit Lxz is comprised of eight dot lines e.g. the case of m=8. In this case, since n=7 and a=3, in the long period L1, the relationship of following equation (2) holds for the pitches Pxn among dot lines.

$$Px1 < Px2 < Px3 < Px4 < Px5 > Px6 > Px7 \quad (2)$$

Further, the pitches Px in the long-period unit Lxz are set so that the maximum phase shift δ expressed by a difference between the maximum value (Px(max)) and the minimum value (Px(min)) of the pitch Px meets (Px(min))×0.01<δ<(Px(min))×0.66, preferably (Px(min)×0.02<δ<(Px(min))×0.5, and more preferably (Px(min))×0.1<δ<(Px(min))×0.4.

For example, in the long-period unit L1 as shown in FIG. 11, the Pxn between dot lines is expressed as described below.

Px1=Px(min)

Px2=Px(min)+δa

Px3=Px(min)+δb=Px(max)

Px4=Px(min)+δc

Px5=Px(min)+δd

Px6=Px(min)+δe

Px7=Px(min)+δf

In addition, values of δa to δf meet Px(min)×0.01<(δa~δf)<Px(min)×0.5, and are the same as in an long-period unit L2 adjacent to the long-period unit L1.

Further, the maximum value of z in the long-period unit Lxz or long-period unit Lyz is set so as to meet 4≤z≤1,000, preferably 4≤z≤100, and more preferably 4≤z≤20.

In addition, the long-period units Lxz and Lyz in the first direction D1 and second direction D2 do not need to be the same as each other.

In the substrate for optics 1 of this Embodiment, it is preferable that at least one or more dot groups having the above-mentioned long-period unit Lyz are arranged in the first direction D1, and that at least one or more dot line groups having the above-mentioned long-period unit Lxz are arranged in the second direction D2.

The arrangement arranged at inconstant intervals with pitches Py is defined by reading the dot lines with dots in the arrangement example of dot lines in the second direction arranged at inconstant intervals with mutually different pitches Px as described above.

Figure 12:
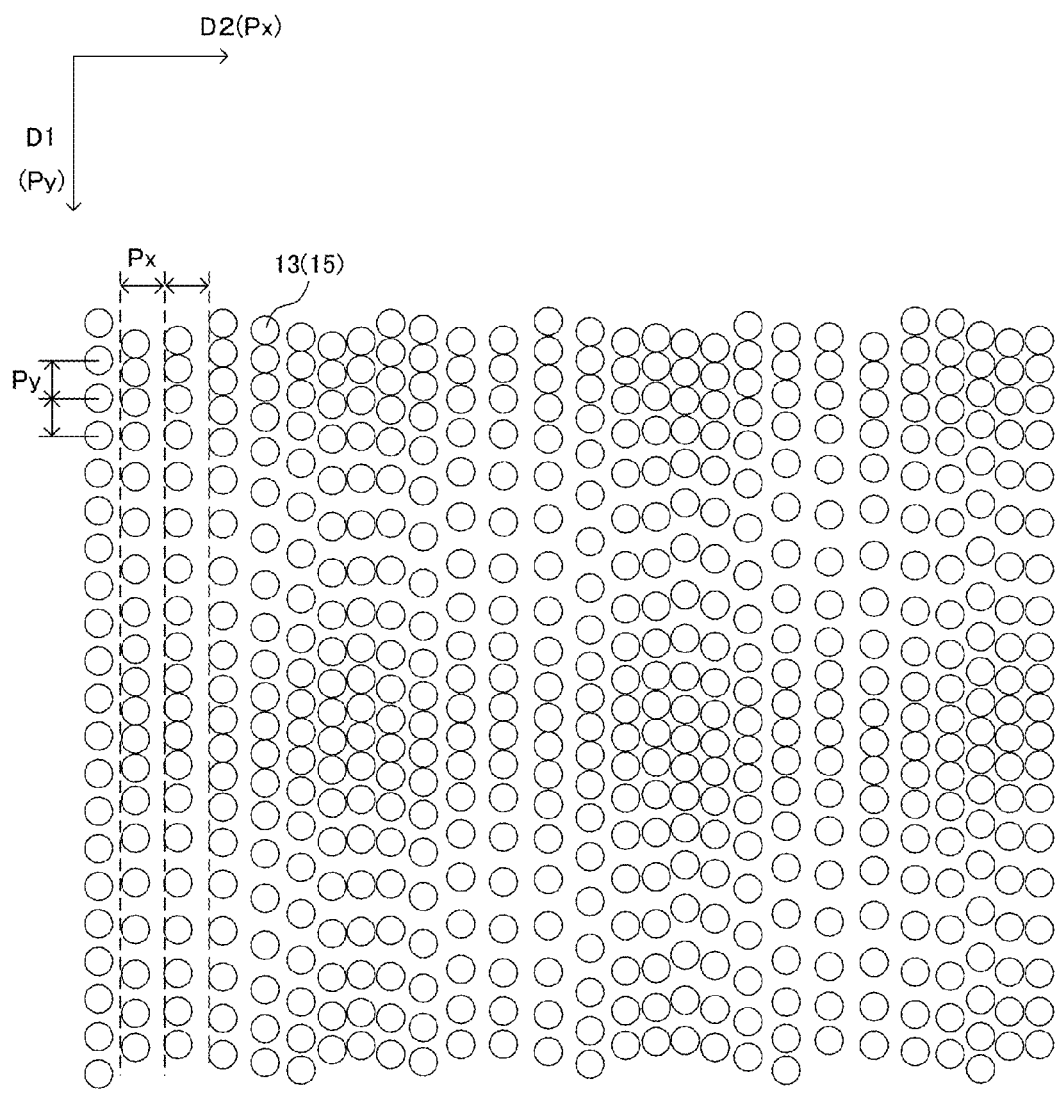
FIG. 12 is a schematic diagram showing another example of the arrangement of a plurality of dots in the substrate for optics according to Embodiment 1.
Figure 13:
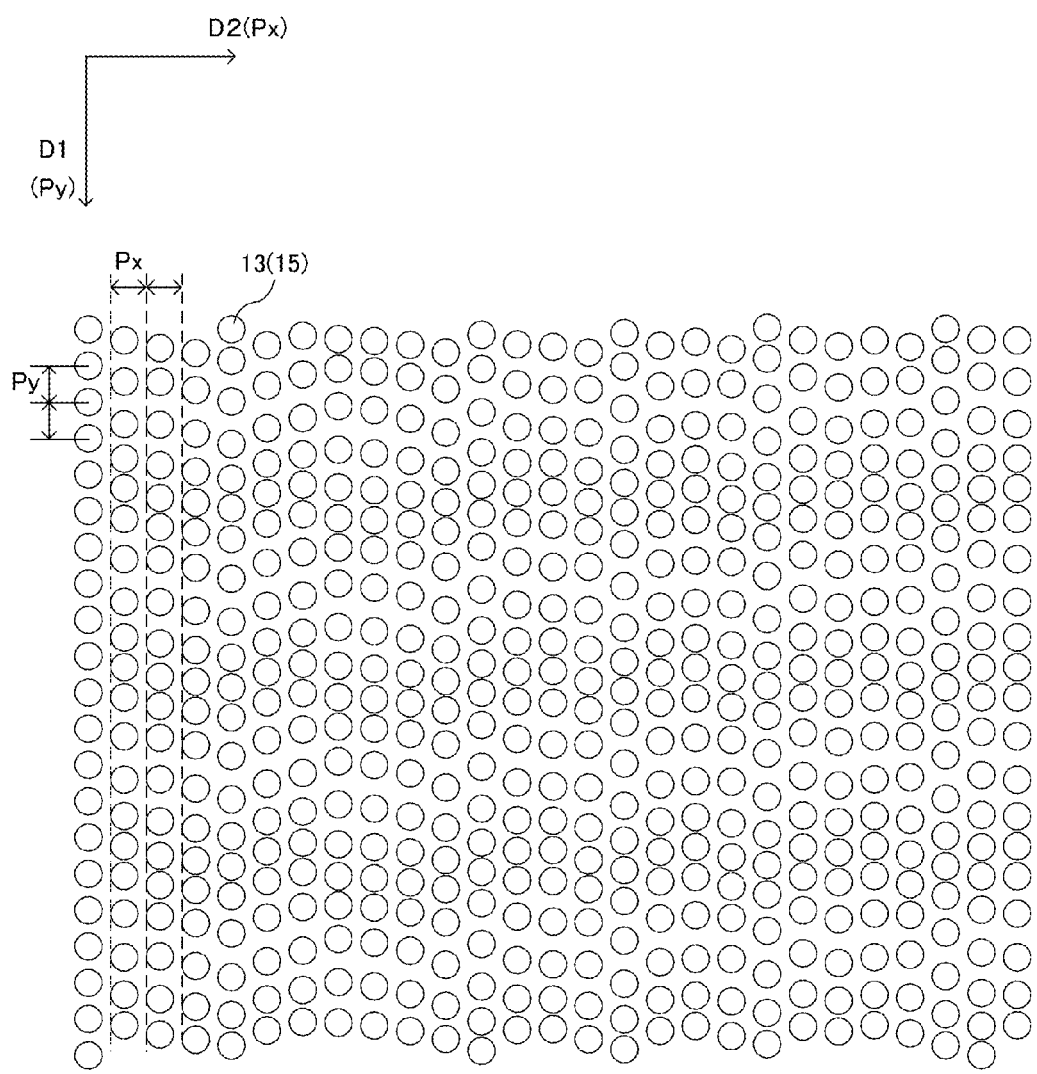
FIG. 13 is a schematic diagram showing still another example of the arrangement of a plurality of dots in the substrate for optics according to Embodiment 1.

In the substrate for optics 1 according to Embodiment 1, dots forming the fine structure of the fine-structure layer 12 (12*a*) can be arranged with pitches Px and Py of inconstant intervals as described above in both the first direction D1 and the second direction D2 (see FIG. 12), and can also be arranged with pitches of inconstant intervals as described above in one of the first direction D1 and the second direction D2, while being arranged with pitches of constant intervals in the other direction (see FIG. 13). In addition, in FIG. 13, dots in the first direction D1 are arranged at inconstant intervals, and dot lines in the second direction D2 are arranged at constant intervals.

Further, it is possible to adopt an arrangement in which adjacent first dot line and second dot line or first dot line and third dot line are aligned (see FIGS. 14, 15, 16 and 17).

In the case where one of the pitch Py and the pitch Px is a constant interval and the other one is an inconstant interval, as compared with the case where both the pitch Py and the pitch Px are inconstant intervals, the concavo-convex interval of nano-order is decreased. By this means, the light scattering effect by disturbance of periodicity decreases, but it is possible to more increase the effect of reducing dislocation defects due to the CVD growth mode, and the effect of reducing contact resistance of the p-type semiconductor layer due to increases in the contact area.

Meanwhile, in the case where both the pitch Py and the pitch Px are inconstant intervals, decrease the effect of reducing dislocation defects due to the CVD growth mode and the effect of reducing contact resistance of the p-type semiconductor layer due to increases in the contact area, but it is possible to more increase the light scattering effect due to disturbance of periodicity.

With respect to whether to make both the pitch Py and the pitch Px inconstant intervals or one of the pitch Py and the pitch Px an inconstant interval, by selecting various manners corresponding to the surface state of the substrate for optics 1, characteristics of the CVD apparatus, generation conditions of the transparent conductive film or anode electrode and p-type semiconductor layer and the like, it is possible to select an optimal structure. For example, in the case of a substrate for optics 1, CVD apparatus or CVD conditions such that dislocation defects are relatively hard to occur, in order to increase the light scattering effect, the structure may be adopted to make both the pitch Py and the pitch Px inconstant intervals. Meanwhile, in the case of a substrate for optics 1, CVD apparatus or CVD conditions that tend to develop relatively more dislocation defects, in order to increase the effect of reducing dislocation defects, the structure may be adopted to make one of the pitch Py and the pitch Px an inconstant interval.

Further, in selecting contact resistance or light scattering effect, by selecting various manners corresponding to generation conditions and types of the transparent conductive film or the electrode pad and the uppermost-layer semiconductor layer, it is possible to select an optimal structure. For example, in the case of a p-type semiconductor layer and transparent conductive film or anode electrode with relatively good ohmic characteristics, in order to increase the light scattering effect, the structure may be adopted to make both the pitch Px and the pitch Py inconstant intervals. Meanwhile, in the case of a p-type semiconductor layer and transparent conductive film or anode electrode where ohmic characteristics are relatively not good, in order to increase the effect of reducing contact resistance, the structure may be adopted to make one of the pitch Py and the pitch Px an inconstant interval.

Furthermore, in the case of an arrangement in which the distance between dots in the first direction or the distance between dot lines in the second direction D2 is a constant interval, the ratio of the pitches of inconstant intervals to the pitch of the constant interval is preferably in a particular range.

Herein, described is an example in which dots in the first direction D1 are arranged at constant intervals Pyc and dot lines in the second direction D2 are arranged at inconstant intervals Px. In this case, it is preferable that the ratio of the pitches Px of the inconstant intervals to the pitch Pyc of the constant interval is in the range of 85% to 100%. When the ratio of the pitches Px of inconstant intervals to the pitch Pyc of the constant interval is 85% or more, overlapping of adjacent dots is small, and such ratios are preferable. Further, when the ratio of the pitches Px of inconstant intervals to the pitch Pyc of the constant interval is 100% or less, the filling rate of the convex portions 13 forming the dots improves, and such ratios are preferable. In addition, it is more preferable that the ratio of the pitches Px of inconstant intervals to the pitch Pyc of the constant interval is in the range of 90% to 95%.

Further, when one long-period unit Lxz or Lyz is comprised of five or more dots (the number of pitches Px or Py belonging thereto is four or more), long-period variations in the refractive index in the wavelength of the light generated inside the semiconductor light emitting layer becomes larger than nano-order, light scattering tends to occur, and therefore, such a case is preferable. Meanwhile, in order to obtain sufficient light extraction efficiency LEE, it is preferable that the long-period unit Lxz or Lyz is comprised of 1,001 or less dots (pitches Px or Py belonging thereto is 1,000 or less.)

In the substrate for optics 1 (1a) according to Embodiment 1, by meeting the relationships of the fine structure of the fine-structure layer 12 (12a) as described above, the light scattering effect is sufficient, while the area density difference of dots(convex portions 13 or concave portions 14) is decreased, and therefore, the effect of reducing dislocation defects occurs. As a result, the dislocation defects in the semiconductor layer are decreased due to concavities and convexities of nano-order while periodicity of nano-order is disturbed, and it is possible to strongly develop the light scattering property with respect to emitted light from the semiconductor layer.

Further, in the substrate for optics 1 (1a) according to Embodiment 1, by meeting the relationships of the fine structure of the fine-structure layer 12 (12a) as described above, the light scattering effect is sufficient, while contact resistance reduces by increases in the contact area due to the area density difference of dots(convex portions 13 or concave portions 14), periodicity of nano-order is concurrently disturbed, and it is possible to strongly develop the light scattering property with respect to emitted light from the semiconductor layer.

Subsequently, described is the dot shape (concavo-convex structure) constituting the fine structure of the fine-structure layer 12 (12a) of the substrate for optics 1 (1a) according to Embodiment 1. The shapes of the convex portion 13 and the concave portion 14 are not limited particularly, as long as the shapes are in the scope that enables the effects of the present invention to be obtained, and it is possible to change as appropriate corresponding to uses. As the shapes of the convex portion 13 and the concave portion 14, for example, it is possible to use the shape of a pillar, the shape of a hole, the shape of a cone, the shape of a pyramid, the shape of an elliptic cone and the like.

In the dot shape (concavo-convex structure) constituting the fine structure of the fine-structure layer 12 (12a) of the substrate for optics 1 (1a) according to this Embodiment, it is preferable that the diameter of each of dots increases/decreases corresponding to the pitch Py and/or the pitch Px.

The example in which the diameter of the dot increases or decreases corresponding to the pitch will specifically be described below.

In the substrate for optics 1 (1a) according to this Embodiment, it is preferable that when the pitch Py is the inconstant interval, dot diameters Dyn of at least four or more and m or less of adjacent dots ($3 \leq n \leq 2a$ or $3 \leq n \leq 2a+1$. In addition, m and a are positive integers and n=m−1.) forming the pitch meet the relationship of following equation (3) while at least one or more dot groups formed with the dot diameters Dy1 to Dyn are arranged in the first direction D1, and that when the pitch Px is the inconstant interval, dot diameters Dxn of at least four or more and m or less of adjacent dots ($3 \leq n \leq 2a$ or $3 \leq n \leq 2a+1$. In addition, m and a are positive integers and n=m−1.) forming the pitch meet the relationship of following equation (4) while at least one or more dot groups formed with the dot diameters Dx1 to Dxn are arranged in the second direction D2.

$$Dy1<Dy2<Dy3<\ldots<Dya>\ldots>Dyn \quad (3)$$

$$Dx1<Dx2<Dx3<\ldots<Dxa>\ldots>Dxn \quad (4)$$

Furthermore, in the substrate for optics 1 (1a) according to this Embodiment, it is preferable that when the pitch Py is the inconstant interval, dot diameters Dyn of at least four or more and m or less of adjacent dots ($3 \leq n \leq 2a$ or $3 \leq n \leq 2a+1$. In addition, m and a are positive integers and n=m−1.) forming the pitch meet the relationship of above-mentioned equation (3) while dot groups formed with the dot diameters Dy1 to Dyn are repeatedly arranged in the long-period unit Lyz in the first direction D1, and that when the pitch Px is the inconstant interval, dot diameters Dxn of at least four or more and m or less of adjacent dots ($3 \leq n \leq 2a$ or $3 \leq n \leq 2a+1$. In addition, m and a are positive integers and n=m−1.) forming the pitch meet the relationship of above-mentioned equation (4) while dot groups formed with the dot diameters Dx1 to Dxn are repeatedly arranged in the long-period unit Lxz in the second direction D2.

Figure 18:
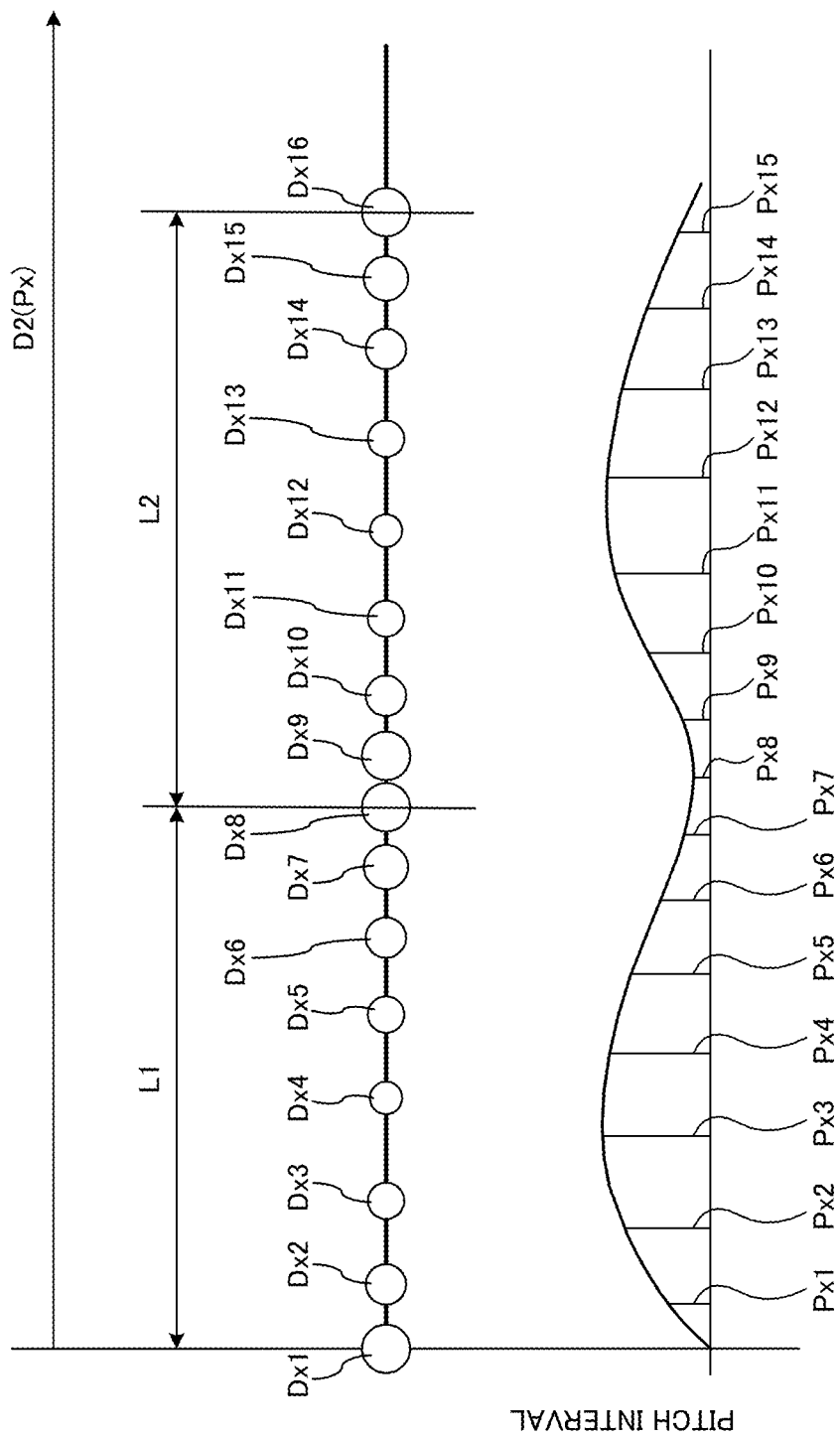
FIG. 18 is a schematic diagram showing an arrangement example of dots having different dot diameters in the second direction in the substrate for optics according to Embodiment 1.

FIG. 18 shows the case where the long-period unit Lxz is comprised of eight dot lines e.g. the case of m=8. In this case, since n=7 and a=3, in the long period L1, the relationship of above-mentioned equation (4) holds for the diameter Dxn of each of dots forming the dot line.

In FIG. 18, when the interval between adjacent dots widens, the dot diameter decreases, and when the dot interval narrows, the dot diameter increases. In the increase/decrease range in which the dot diameter increases and decreases, in the case of too large, adjacent dots contact each other, and such a case is not preferable. In the case of too small, light extraction efficiency decreases, and such a case is not preferable. In the case of within ±20% with respect to the average diameter of dots in the same long-period unit Lxz, light extraction efficiency increases, and such a case is preferable.

By the above-mentioned configuration, disturbance of periodicity due to dots with respect to emitted light is large, and light extraction efficiency increases in the semiconductor light emitting device.

Further, in the dot shape (concavo-convex structure) constituting the fine structure of the fine-structure layer 12 (12a) of the substrate for optics 1 (1a) according to this Embodiment, it is preferable that the height of each of dots increases/decreases corresponding to the pitch Py and/or the pitch Px.

The example in which the height of the dot increases or decreases corresponding to the pitch will specifically be described below.

In the substrate for optics 1 (1a) according to this Embodiment, it is preferable that when the pitch Py is the inconstant interval, dot heights Hyn of at least four or more and m or less of adjacent dots ($3 \leq n \leq 2a$ or $3 \leq n \leq 2a+1$. In addition, m and a are positive integers and n=m−1.) forming the pitch meet the relationship of following equation (5) while at least one or more dot groups formed with the dot heights Hy1 to Hyn are arranged in the first direction D1, and that when the pitch Px is the inconstant interval, dot heights Hxn of at least four or more and m or less of adjacent dots ($3 \leq n \leq 2a$ or $3 \leq n \leq 2a+1$. In addition, m and a are positive integers and n=m−1.) forming the pitch meet the relationship of following equation (6) while at least one or more dot groups formed with the dot heights Hx1 to Hxn are arranged in the second direction D2.

$$Hy1 < Hy2 < Hy3 < \ldots < Hya > \ldots > Hyn \quad (5)$$

$$Hx1 < Hx2 < Hx3 < \ldots < Hxa > \ldots > Hxn \quad (6)$$

Further, in the substrate for optics 1 (1a) according to this Embodiment, it is preferable that when the pitch Py is the inconstant interval, dot heights Hyn of at least four or more and m or less of adjacent dots ($3 \leq n \leq 2a$ or $3 \leq n \leq 2a+1$. In addition, m and a are positive integers and n=m−1.) forming the pitch meet the relationship of above-mentioned equation (5) while dot groups formed with the dot heights Hy1 to Hyn are repeatedly arranged in the long-period unit Lyz in the first direction D1, and that when the pitch Px is the inconstant interval, dot heights Hxn of at least four or more and m or less of adjacent dots ($3 \leq n \leq 2a$ or $3 \leq n \leq 2a+1$. In addition, m and a are positive integers and n=m−1.) forming the pitch meet the relationship of above-mentioned equation (6) while dot groups formed with the dot heights Hx1 to Hxn are repeatedly arranged in the long-period unit Lxz in the second direction D2.

Figure 19:
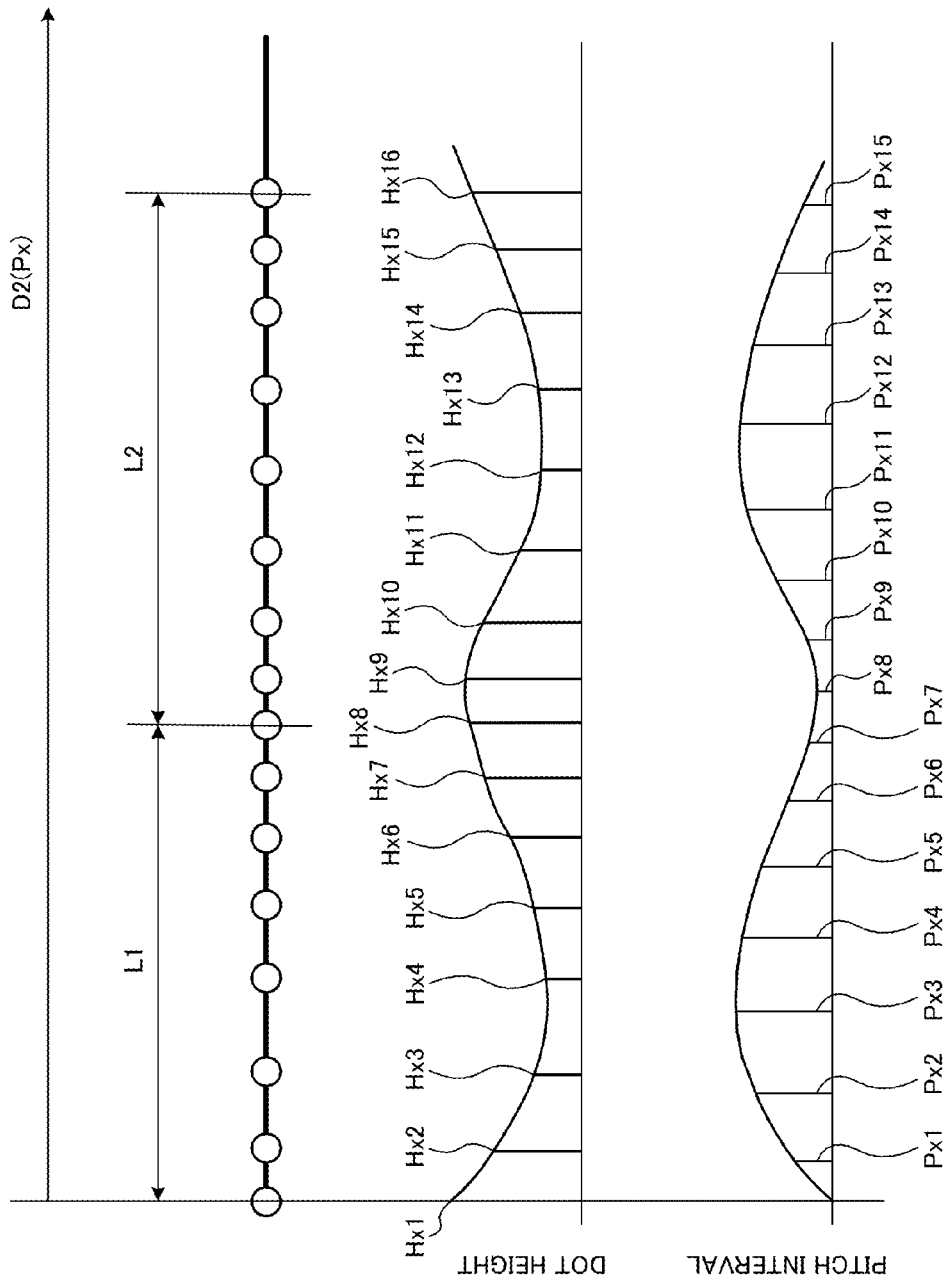
FIG. 19 is a schematic diagram showing an arrangement example of dots having different dot heights in the second direction in the substrate for optics according to Embodiment 1.

FIG. 19 shows the case where the long-period unit Lxz is comprised of eight dot lines e.g. the case of m=8. In this case, since n=7 and a=3, in the long period L1, the relationship of above-mentioned equation (6) holds for the height Hxn of each of dots forming the dot line.

In FIG. 19, when the interval between adjacent dots widens, the dot height decreases, and when the dot interval narrows, the dot height increases. In the increase/decrease range in which the dot height increases and decreases, in the case of too large, fluctuations in light extraction efficiency are large in the portion, and such a case is not preferable. In the case of too small, the effect of enhancing light extraction efficiency due to increase/decrease in the dot height decreases, and such a case is not preferable. In the case of within ±20% with respect to the average height of dots in the same long-period unit Lxz, light extraction efficiency increases without fluctuations, and such a case is preferable.

By the above-mentioned configuration, disturbance of periodicity due to dots with respect to emitted light is large, and light extraction efficiency increases in the semiconductor light emitting device.

Further, the substrate for optics 1 (1a) according to this Embodiment is characterized by being provided with the fine-structure layer 12 (12a) including a plurality of dots comprised of a plurality of convex portions 13 or concave portions 14 extending in the direction of from the main surface of the substrate 11 (11a) to outside the surface, where the fine-structure layer 12 (12a) forms dot lines such that a plurality of dots is arranged at constant intervals Py in the first direction D1 in the main surface of the substrate 11 (11a), the dot lines are provided parallel with the pitch Px of the constant interval in the second direction D2 orthogonal to the first direction D1, and a shift amount α1 in the first direction D1 between adjacent first dot line and second dot line is different from a shift amount α2 in the first direction D1 between the second dot line and a third dot line adjacent to the second dot line.

According to this configuration, first, the pitch Py and pitch Px are both of the constant interval, and have the periodical structure, while the shift amounts α1 and α2 in the first direction D1 between dot lines are different from each other, periodicity is thereby disturbed in the arrangement of a plurality of dots forming the fine-structure layer 12 (12a), and it is thereby possible to produce the light scattering effect.

Further, according to this configuration, in the fine-structure layer 12 (12a), since a plurality of dot lines provided parallel with the constant interval pitch Px of nano-order is provided on the surface of the substrate, in providing a semiconductor layer on the surface of the substrate, the CVD growth mode of the semiconductor layer is disturbed, and dislocation defects associated with phase growth collide to disappear. By this means, it is possible to decrease dislocation defects in the semiconductor crystal, and it is thereby possible to increase internal quantum efficiency IQE of the semiconductor light emitting device.

Furthermore, since the concavities and convexities of nano-order are formed, it is possible to more increase the effect of reducing contact resistance of the p-type semiconductor layer due to increase in the contact area.

Figure 20:
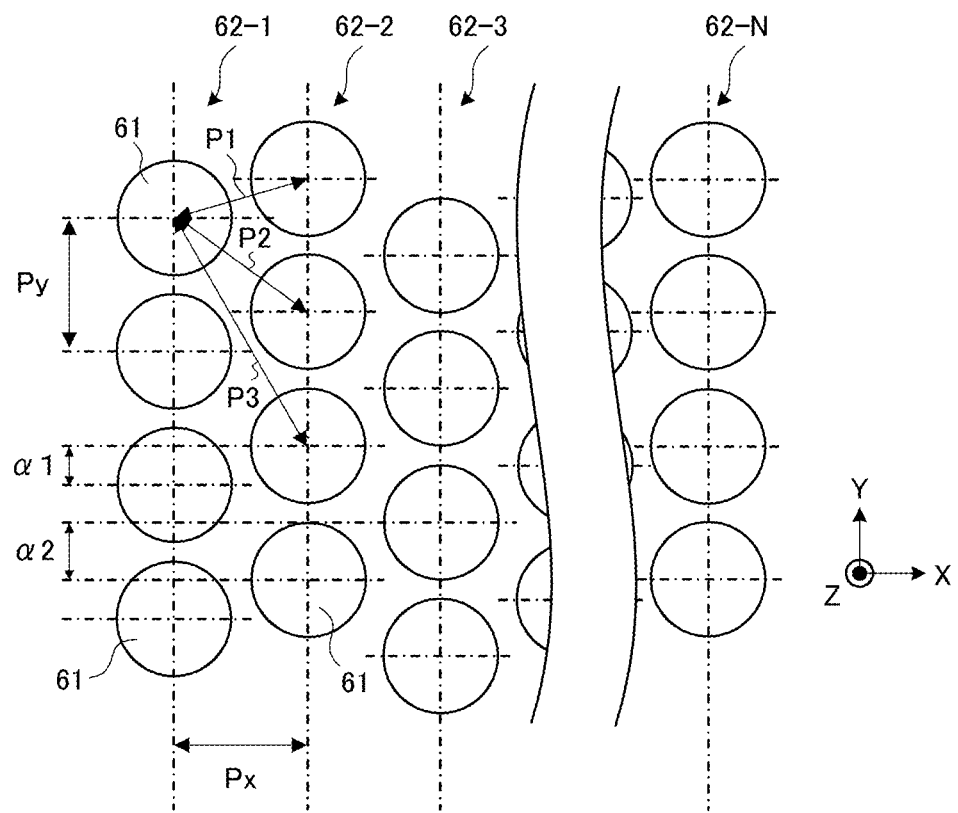
FIG. 20 is a plan schematic diagram of a substrate for optics in Embodiment 2.

FIG. 20 is a plan schematic diagram of a substrate for optics according to Embodiment 2 of the present invention. In a substrate for optics 60 according to Embodiment 2, a plurality of dots 61 is arranged at constant intervals with a pitch Py in the Y-axis direction in the main surface of the substrate itself and forms dot lines 62-1 to 62-N. The dot lines 62-1 to 62-N are provided parallel with a pitch Px of a constant interval in the X-axis direction orthogonal to the Y-axis direction in the main surface of the substrate itself. Then, the lines are arranged so as to create a shift amount α (position difference) in the Y-axis direction between mutually adjacent dot lines.

In other words, in the substrate for optics 60 according to Embodiment 2, the concavo-convex structure is provided so that a shift amount α1 in the Y-axis direction between the first dot line 62-1 and the second dot line 62-2 adjacent to each other in the X-axis direction is different from a shift amount α2 between the second dot line 62-2 and the third dot line 62-3 adjacent to the second dot line 62-2.

By this configuration, pitches P1 to P3 among a plurality of dots 61 in the slanting direction in the main surface of the substrate itself are irregular, periodicity of the repetition pattern is thereby reduced, and the light scattering property due to the concavo-convex structure is thereby more enhanced.

Further, in the substrate for optics 60 according to Embodiment 2, it is preferable that a difference between the shift mount α1 and the shift amount α2 is not constant. By this configuration, periodicity of the arrangement of the plurality of dots 61 forming the concavo-convex structure i.e. periodicity of the repetition pattern is more reduced, it is possible to further strengthen the light scattering effect, and it is thereby possible to improve light extraction efficiency of the semiconductor light emitting device. Further, it is possible to produce the effect of reducing dislocation defects due to the CVD growth mode.

Furthermore, in the substrate for optics 60 according to Embodiment 2, both the pitch Py and pitch Px are provided to be constant intervals. Therefore, as compared with the case where only the pitch Px is the constant interval, and the pitch Py in the Y-axis direction has the variable width δ and is the inconstant interval in the substrate for optics 1 according to Embodiment 1, intervals among the dots 61 are decreased. By this means, the light scattering effect due to disturbance of periodicity decreases, but it is possible to more increase the effect of reducing dislocation defects due to the CVD growth mode.

Still furthermore, as compared with the substrate for optics 1 according to Embodiment 1 in which the pitch Py is the inconstant interval, the effect of reducing dislocation defects due to the CVD growth mode decreases, but it is possible to more increase the light scattering effect due to disturbance of periodicity of the arrangement of the plurality of dots 61.

In this case, it is preferable that a difference between the shift mount α1 and the shift amount α2 is not constant. By this configuration, the light scattering effect is further improved, and it is thereby possible to resolve the waveguide mode and to further enhance light extraction efficiency.

Further, in the substrates for optics according to Embodiments 1 and 2 as described above, it is preferable that each of the pitch Px and the pitch Py ranges from 100 nm to 1,000 nm. When the pitches Px and Py are in this range, the concavities and convexities of nano-order are provided on the surface of the substrate for optics, and it is thereby possible to decrease the number of dislocation defects in a semiconductor layer in the case where the semiconductor layer is provided on the surface of the substrate for optics. By the pitches Px and Py of 100 nm or more, light extraction efficiency LEE of the LED increases, and the effect of reducing dislocation defects appears which contributes to improvements in luminous efficiency. Further, by the pitches Px and Py of 1,000 nm or less, the effect of decreasing the number of dislocation defects is maintained.

Also when the substrate for optics is provided on the uppermost surface of the semiconductor light emitting device, it is preferable that each of the pitch Px and the pitch Py ranges from 100 nm to 1,000 nm. In order to suppress emission light attenuation due to the absorption coefficient, the p-type semiconductor layer provided on the uppermost surface of the semiconductor light emitting device is configured substantially in the thickness of several micrometers. Therefore, it is necessary to control the depth of concavities and convexities provided on the surface of the p-type semiconductor layer to within 1,000 nm or less. Since the aspect ratio that is the ratio between the pitches Px and Py and the depth is preferably 1 or more to improve light extraction efficiency, it is preferable that each of the pitch Px and the pitch Py ranges from 100 nm to 1,000 nm. Further, in the case where each of the pitch Px and the pitch Py is 1,000 nm or less, adhesion is improved between the p-type semiconductor layer 204 and the transparent conductive film 206 that is the substrate for optics according to this Embodiment in FIG. 2 or the p-type semiconductor layer 304 that is the substrate for optics according to this Embodiment and the anode electrode 307 in FIG. 3, and such a case is preferable.

Subsequently, described are principles that light extraction efficiency is improved by the substrate for optics according to this Embodiment.

As described previously, by providing the fine-structure layer comprised of concavities and convexities (dots) of nano-order on a substrate for optics, it is possible to obtain the effect of improving light extraction efficiency LEE by resolving the waveguide mode due to light scattering.

By repeatedly arranging the long-period unit Lxz comprised of a plurality of dots, the refractive index changes each long-period unit Lxz, and the same effect is exerted as in the case where a plurality of dots forming the long-period unit Lxz is repeated as a single unit. In other words, in the case of a plurality of dots of the same order as the wavelength, since it is possible to explain the behavior of light by the average distribution of the refractive index (effective medium approximation), in calculating the spatial average refractive index distribution, light is acted as if a plurality of dots of the long-period unit Lxz is repeated as a single unit. A plurality of dots thus arranged in the long-period unit Lxz exhibits the light scattering effect.

Further, in the substrate for optics according to this Embodiment, the diameter of each of dots increases or decreases corresponding to the pitch. The spatial average refractive index distribution changes, while depending on the volume fraction of the configuration unit. Therefore, in a plurality of dots of the long-period unit Lxz, when the volume of each dot changes, a change in the average refractive index distribution is increased corresponding thereto, and the light scattering effect is further increased even in the same long-period unit Lxz. This effect is remarkable by increasing the diameter of the dots when the pitches between dots are narrow, or decreasing the diameter of the dots when the pitches between dots are wide.

Furthermore, in the substrate for optics according to this Embodiment, the height of the dot also increases or decreases corresponding to the pitch between dots. Also in this case, by the same reason as described above, by increasing the height of the dots when the pitches between dots are narrow, or decreasing the height of the dots when the pitches between dots are wide, the average refractive index distribution inside the long-period unit Lxz is large, and the light scattering effect is increased.

Still furthermore, in the arrangement in which the long-period unit Lxz comprised of a plurality of dots is repeatedly arranged, in the case of increasing or decreasing both the diameter of each of the dots and the height of the dot as described above corresponding to the pitch, the difference in the refractive index distribution described by effective medium approximation is further increased, and such a case is preferable. In this case, by increasing the diameter of the dot and the height of the dots when the pitches between dots are narrow, or decreasing the diameter of the dots and the height of the dots when the pitches between dots are wide, in the spatial average refractive index distribution, the difference in the volume fraction of the configuration unit is large, the light scattering effect is further increased, and such a case is preferable.

In the substrate for optics according to this Embodiment, materials of the substrate itself are not limited particularly, as long as it is possible to use the materials as a substrate for a semiconductor light emitting device. For example, it is possible to use substrates of sapphire, SiC, SiN, GaN, silicon, zinc oxide, magnesium oxide, manganese oxide, zirconium oxide, manganese oxide-galvanized iron, magnesium aluminum oxide, zirconium boride, gallium oxide, indium oxide, lithium gallium oxide, lithium aluminum oxide, neodymium gallium oxide, lanthanum strontium aluminum tantalum oxide, strontium titanium oxide, titanium oxide, hafnium, tungsten, molybdenum, GaP, GaAs and the like. Among the materials, from the viewpoint of lattice matching with the semiconductor layer, it is preferable to apply substrates of sapphire, GaN, GaP, GaAs, SiC and the like. Further, the substrate may be used alone, or a substrate of a hetero structure may be used in which another substrate is provided on the substrate itself using the materials.

Further, in the substrate for optics according to this Embodiment, materials of the p-type semiconductor layer are not limited particularly, as long as it is possible to use the materials as the p-type semiconductor layer suitable for an LED. For example, it is possible to apply elemental semiconductors such as silicon and germanium, and materials obtained by doping various elements to compound semiconductors of group III-V, group II-VI, group VI-VI and the like as appropriate.

In the substrate for optics according to this Embodiment, materials of the transparent conductive film are not limited particularly, as long as it is possible to use the materials as the transparent conductive film suitable for an LED. For example, it is possible to apply metal thin films of a Ni/Au electrode and the like, conductive oxide films of ITO, ZnO, $In_2O_3$, $SnO_3$, IZO, IGZO and the like, etc. Particularly, from the viewpoints of transparency and conductivity, ITO is preferable.

Described next is a semiconductor light emitting device to which is applied the substrate for optics according to this Embodiment of the present invention.

The semiconductor light emitting device according to this Embodiment includes at least one or more substrates for optics according to this Embodiment as described above in the configuration. By incorporating the substrate for optics according to this Embodiment into the configuration, it is possible to obtain improvements in IQE, improvements in EIE, and improvements in LEE.

For example, the semiconductor light emitting device according to this Embodiment has a layered semiconductor layer configured by layering at least two or more semiconductor layers and a light emitting layer on the substrate main surface. Then, the layered semiconductor layer is provided with the fine-structure layer including dots comprised of a plurality of convex portions or concave portions extending in the direction of from the main surface of the uppermost-surface semiconductor layer to outside the surface, and the fine-structure layer corresponds to the fine structure of the substrate for optics according to the above-mentioned Embodiments. The layered semiconductor layer is as described using FIGS. 1 to 3.

In the semiconductor light emitting device according to this Embodiment, as then-type semiconductor layer, materials are not limited particularly, as long as it is possible to use the materials as the n-type semiconductor layer suitable for the LED. For example, it is possible to apply elemental semiconductors such as silicon and germanium, and materials obtained by doping various elements to compound semiconductors of group III-V, group II-VI, group VI-VI and the like as appropriate. Further, it is possible to provide the n-type semiconductor layer and p-type semiconductor layer respectively with an n-type clad layer and p-type clad layer not shown, as appropriate.

As the light emitting semiconductor layer, materials are not limited particularly, as long as the materials have the light emitting property as the LED. For example, as the light emitting semiconductor layer, it is possible to apply semiconductor layers of AsP, GaP, AlGaAs, InGaN, GaN, AlGaN, ZnSe, AlHaInP, ZnO and the like. Further, the light emitting semiconductor layer may be doped with various elements as appropriate corresponding to characteristics.

It is possible to deposit the layered semiconductor layer (n-type semiconductor layer, light emitting semiconductor layer, and p-type semiconductor layer) on the substrate surface by publicly-known techniques. For example, as the deposition method, it is possible to apply the organic metal vapor phase growth method (MOCVD), hydride vapor phase growth method (HVPE), molecular beam epitaxial growth method (MBE) and the like.

Subsequently, described is a method of manufacturing the substrate for optics according to this Embodiment. In addition, the manufacturing method as shown below is an example, and the method of manufacturing the substrate for optics is not limited thereto.

An exposure apparatus is used in manufacturing the substrate for optics. The exposure apparatus according to this Embodiment is an exposure apparatus for pulse-exposing a roll-shaped member with the surface coated with a resist layer to laser light and forming an exposed pattern comprised of a plurality of exposed portions on the resist layer, an exposure apparatus is characterized by being provided with a rotation control section that rotates the roll-shaped member on the center axis, a processing head portion that applies the laser light, axis-direction shift means for shifting the processing head portion along the long-axis direction of the roll-shaped member, and an exposure control section which repeats pulse exposure based on a pulse signal phase-modulated based on a reference signal synchronized with rotation of the rotation control section, and controls the processing head portion so as to form the exposed pattern along the circumference of the roll-shaped member.

Further, the exposure apparatus according to this Embodiment is an exposure apparatus for pulse-exposing a roll-shaped member with the surface coated with a resist layer to laser light and forming an exposed pattern comprised of a plurality of exposed portions on the resist layer, an exposure apparatus is characterized by being provided with a rotation control section that rotates the roll-shaped member on the center axis, a processing head portion that applies the laser light, axis-direction shift means for shifting the processing head portion along the long-axis direction of the roll-shaped member at a shift velocity varying periodically, and an exposure control section which repeats pulse exposure based on a pulse signal controlled based on a reference signal synchronized with rotation of the rotation control section, and controls the processing head portion so as to form the exposed pattern along the circumference of the roll-shaped member.

Figure 21:
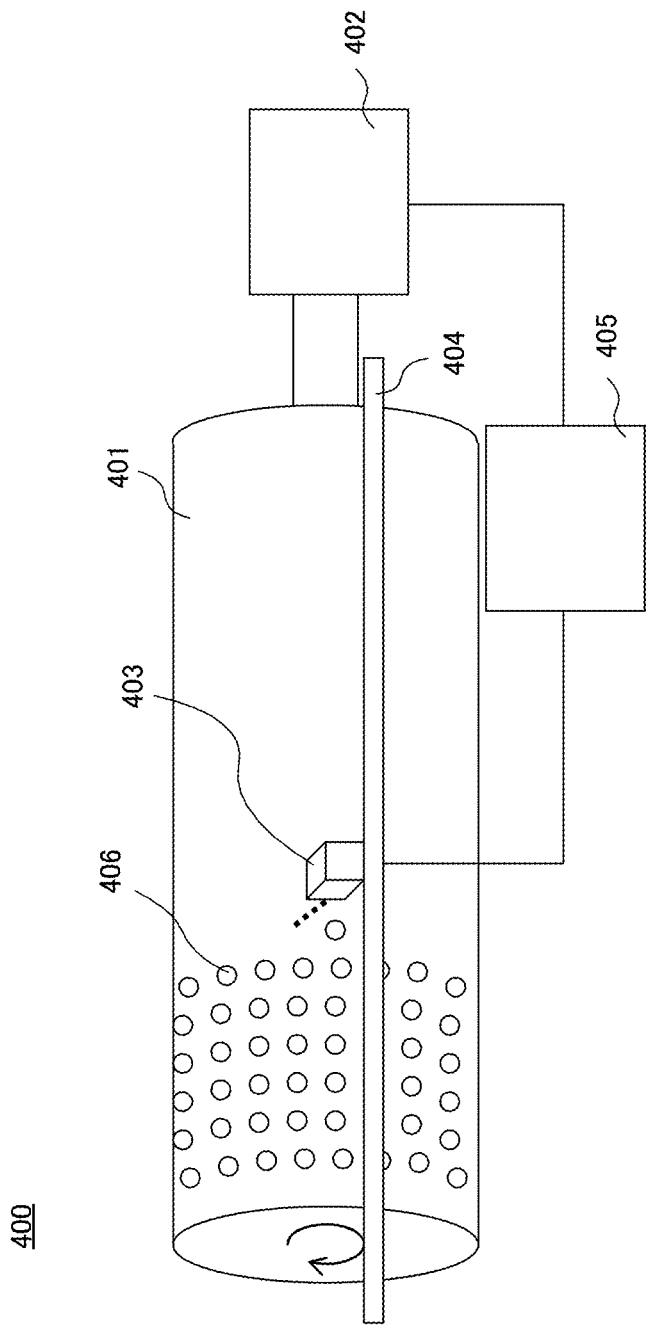
FIG. 21 is a schematic configuration diagram of an exposure apparatus according to an Embodiment of the present invention.

The exposure apparatus for nano-imprint mold formation according to this Embodiment will be described first with reference to FIG. 21. FIG. 21 is a schematic configuration diagram of the exposure apparatus according to this Embodiment.

The exposure apparatus according to this Embodiment pulse-exposes a surface of a roll-shaped member coated with a resist layer, to laser light, with a dot pattern to form on the surface of a mold for imprint to manufacture the substrate for optics according to the above-mentioned Embodiment by transfer forming, and forms an exposed pattern comprised of a plurality of exposed portions on the resist layer Herein, the mold for imprint has dots in the shape corresponding to dots to form on the main surface of the substrate for optics according to the above-mentioned Embodiments. In other words, a dot pattern is formed on the surface of the mold for imprint. This dot pattern is transferred onto the main surface of the substrate for optics to form a plurality of dots of the fine-structure layer. In order to form the dot pattern on the mold for imprint, by using the exposure apparatus as described below, the resist layer, which is provided on the surface of the substrate for the mold for imprint, is exposed.

As shown in FIG. 21, an exposure apparatus 400 grasps a roll-shaped member 401 coated with a resist layer with a roll grasp portion not shown, and is provided with a rotation control section 402, processing head portion 403, shift mechanism section 404, and exposure control section 405. The rotation control section 402 rotates the roll-shaped member 401 on the center of the roll-shaped member 401 as the axis. The processing head portion 403 applies laser light to expose the resist layer of the roll-shaped member 401. The shift mechanism section 404 shifts the processing head portion 403 at a control velocity along the long-axis direction of the roll-shaped member 401. The exposure control section 405 controls pulse signals of laser exposure by the processing head portion 403, based on a reference signal synchronized with rotation of the roll-shaped member 401 by the rotation control section 402.

Processing of the roll-shaped member 401 with the exposure apparatus 400 is performed by applying a pulse laser from the processing head portion 403, while rotating the roll-shaped member 401. The processing head portion 403 shifts along the long-axis direction of the roll-shaped member 401 by the shift mechanism 404, while applying the pulse laser. A pattern 406 is recorded at arbitrary pitches on the resist layer of the outer periphery of the roll-shaped member 401 in the rotation direction, from the number of revolutions of the roll-shaped member 401 and the frequency of the pulse laser. This is the pitch Py in the first direction D1 in the roll-to-roll nano-imprint mold.

Further, since the scan is made along the long-axis direction of the roll-shaped member 401, when the roll-shaped member 401 rotates once from an arbitrary position, the processing head portion 403 is shifted in the long-axis direction. This is the pitch Px in the second direction D2 in the roll-to-roll nano-imprint mold. As compared with the circumference length of the roll-shaped member 401, the pitches Py and Px of the pattern 406 are of the order of nanometers and are thus extremely small, and therefore, it is possible to form the line-shaped pattern with the shift amount in first direction D1 differing viewed in the long-axis direction, while maintaining the pitch Py in the first direction D1. Furthermore, as described above, since the pitches Py and Px of the pattern 406 are extremely small as compared with the circumference length of the roll-shaped member 401, the first direction D1 and the second direction D2 are substantially orthogonal.

The roll-shaped member 401 is obtained by providing the member formed in the shape of a cylinder with the rotating axis, and as the materials, it is possible to apply metal, carbon core, glass, quartz and the like. The roll-shaped member 401 needs processing precision permitting high rotation, and therefore, preferred as the materials are metal, carbon core and the like. Further, it is possible to coat only the cylindrical surface portion undergoing laser exposure with a different material. Particularly, when a heat-reactive resist is used, in order to enhance the heat insulation effect, it is preferable to apply materials with lower thermal conductivity than that of metal, and examples thereof are glass, quartz, oxide, nitride and the like. It is also possible to use the layer with which the cylindrical surface is coated as an etching layer to etch with a resist layer described later as a mask.

The resist to coat the roll-shaped member 401 is not limited particularly, as long as the resist may be exposed to laser light, and it is possible to apply photocurable resists, light-amplification type resists, heat-reactive resists and the like. Particularly, heat-reactive resists allow pattern formation with wavelengths smaller than the wavelength of laser light, and are preferable.

As heat-reactive resists, organic resists or inorganic resists are preferable. The resist layer formed from these resists may be a single-layer structure, or multi-layer structure obtained by combining a plurality of resist layers. In addition, it is possible to change which resist to select as appropriate according to the process, required processing accuracy and the like. For example, organic resists allow coating with a roll coater or the like in forming a resist layer to coat the roll-shaped member 401, and the process is thereby easy. However, the viscosity of the resist is limited because of coating onto a sleeve, and it is difficult to obtain coating thickness accuracy and control or multi-layer coating.

As organic resists, as described in "Latest Resist Material Handbook" published by Johokiko Co., Ltd. and "Photopolymer Handbook", Kogyo Chosakai Publishing Co., Ltd., examples thereof are novolac resins, mixtures of novolac resins and diazonaphthoquinone, methacrylate-based resins, polystyrene-based resins, polyethylene-based resins, phenol-based resins, polyimide-based resins, polyamide-based resins, silicone resins, polyester-based resins, epoxy-based resins, melamine-based resins, and vinyl-based resins.

Meanwhile, inorganic resists are suitable for providing the resist layer to coat the roll-shaped member 401 by the resistance heating evaporation method, electron-beam sputtering method, vapor-phase method such as the CVD method or the like. Since these methods are basically of vacuum process, although the number of steps is required to form on the sleeve, it is possible to control the film thickness with accuracy, and it is easy to layer in multi-layer.

It is possible to select various inorganic resist materials corresponding to the reaction temperature. For example, among the inorganic resist materials are Al, Si, P, Ni, Cu, Zn, Ga, Ge, As, Se, In, Sn, Sb, Te, Pb, Bi, Ag, Au and their alloys. Further, as the inorganic resist materials, oxides, nitrides, nitrogen oxides, carbides, hydrosulphides, sulfide, fluorides, and chlorides of Mg, Al, Si, Ca, Ti, V, Cr, Mn, Fe, Co, Ni, Cu, Zn, Ga, Ge, As, Se, Sr, Y, Zr, Nb, Mo, Pd, Ag, In, Sn, Sb, Te, Ba, Hf, Ta, W, Pt, Au, Pb, Bi, La, Ce, Sm, Gd, Tb and Dy, and mixtures of such compounds may be applied.

When a heat-reactive resist is used as the resist to coat the roll-shaped member 401, in the case of exposing with a pulse signal that is phase-modulated based on a reference signal synchronized with rotation described later, the diameter of each of dots forming the pattern increases or decreases corresponding to the pitch Py and/or pitch Px, and the heat-reactive resin is thus preferable. In the case of using the heat-reactive resist, although an explicit mechanism that the diameter of the dot increases/decreases corresponding to the pitch is unknown, the mechanism is assumed as described below.

In the case of a heat-reactive resist, a change occurs in the material forming the resist layer by applied heat energy of a laser applied to an applied portion, and a pattern is formed by etching characteristics changing. At this point, all of the applied heat energy is not used in the change of the resist layer, and a part thereof is stored and transferred to an adjacent area. Therefore, heat energy in an area of the resist layer is the total of the applied heat energy applied by the laser and heat-transfer energy from an adjacent area. In pattern formation of nano-order, contribution of this heat-transfer energy is not neglected, contribution of heat-transfer is inversely proportional to the distance between dots forming the pattern, and as a result, the obtained pattern diameter undergoes the effect of the distance between adjacent dots.

Herein, when the distance between dots changes by phase modulation, the contribution of the heat-transfer energy as described above varies for each dot. When the distance between dots is wide, contribution of heat-transfer energy is small, and the dot diameter decreases. When the distance between dots is narrow, contribution of heat-transfer energy is large, and the dot diameter increases.

Further, when the etching layer described later is provided using a heat-reactive resist as the resist to coat the roll-shaped member 401 and the processing depth of the pattern is controlled, as in the same manner as described previously, in the case of exposing with a pulse signal that is phase-modulated based on a reference signal synchronized with rotation, the height of each of dots forming the pattern increases or decreases corresponding to the pitch Py and/or pitch Px, and the heat-reactive resist is thus preferable. In the case of using the heat-reactive resist and etching layer together, although a mechanism that the height of the dot increases/decreases corresponding to the pitch Px is unknown, it is possible to explain from the fact that the dot diameter increases/decreases corresponding to the distance between dots as described above.

In other words, in patterning of nano-order, the etching depth increases or decreases corresponding to the dot diameter, and there is a tendency that the etching depth is deep when the dot diameter is wide, and that the etching depth is shallow when the dot diameter is narrow. Particularly, this tendency is remarkable when the etching technique is dry etching. It is conceivable this is because exchange of an etchant or removal of etching products is not carried out promptly.

As described previously, in using the heat-reactive resist, the dot diameter is small when the distance between dots is wide, while the dot diameter is large when the distance between dots is narrow. Since there is the tendency that the etching depth increases or decreases corresponding to the dot diameter, as a result, the dot depth is shallow when the distance between dots is large, while the dot depth is deep when the distance between dots is narrow.

The effects of increases/decreases in the distance between dots, dot diameter and dot depth as described above are remarkable when the average pitch is small. It is presumed this is because the above-mentioned effect of heat-transfer energy is larger.

In the present invention, it is possible to apply as the roll-to-roll nano-imprint mold without modification by using the resist layer to coat the roll-shaped member 401, or it is possible to form a pattern by etching the surface substrate of the roll-shaped member 401 using the resist layer as a mask.

By providing the etching layer on the roll-shaped member 401, it is possible to control the processing depth of the pattern freely, and to select a film thickness most suitable for processing as the thickness of the heat-reactive resist. In other words, by controlling the thickness of the etching layer, it is possible to control the processing depth freely. Further, it is possible to control the processing depth with the etching layer, and therefore, a film thickness easy to expose and develop may be selected for the heat-reactive resist layer.

The wavelength of a laser used in the processing head portion 403 to perform exposure preferably ranges from 150 nm to 550 nm. Further, in terms of miniaturization of wavelength and easiness of availability, it is preferable to use a semiconductor laser. The wavelength of the semiconductor laser preferably ranges from 150 nm to 550 nm. This is because when the wavelength is shorter than 150 nm, output power of the laser is small, and it is difficult to expose the resist layer with which the roll-shaped member 401 is coated.

Meanwhile, this is because when the wavelength is longer than 550 nm, it is not possible to make the spot diameter of the laser 500 nm or less, and it is difficult to form a small exposed portion.

Meanwhile, to form an exposed portion with a small spot size, it is preferable to use a gas laser as the laser used in the processing head portion 403. Particularly, in gas lasers of XeF, XeCl, KrF, ArF, and F2, the wavelengths are 351 nm, 308 nm, 248 nm, 193 nm and 157 nm and thus short, it is thereby possible to focus light on an extremely small spot size, and therefore, such lasers are preferable.

Further, as the laser used in the processing head portion 403, it is possible to use a second harmonic, third harmonic and fourth harmonic of a Nd:YAG laser. The wavelengths of the second harmonic, third harmonic and fourth harmonic of the Nd:YAG laser are respectively 532 nm, 355 nm, and 266 nm, and allow to obtain a small spot size.

In the case of forming a fine pattern in the resist layer provided on the surface of the roll-shaped member 401 by exposure, rotation position accuracy of the roll-shaped member 401 is significantly high, and manufacturing is made ease by first adjusting the optical system of the laser so that the member surface is in the focus depth. However, it is very difficult to hold roll dimension accuracy and rotation accuracy adapted to nano-imprint. Therefore, it is preferable that the laser used in exposure is concentrated with an objective lens and is set for autofocus so that the surface of the roll-shaped member 401 always exists in the focus depth.

The rotation control section 402 is not limited particularly, as long as the section is an apparatus having the function of rotating the roll-shaped member 401 on the center of the roll as the axis, and for example, a spindle motor or the like is suitable.

As the shift mechanism section 404 that shifts the processing head portion 403 in the long-axis direction of the roll-shaped member 401, the section 404 is not limited particularly, as long as the section is able to shift the processing head portion 403 at a controlled velocity, and suitable examples are a linear servo motor and the like.

In the exposure apparatus 400 as shown in FIG. 21, the exposure control section 405 controls the position of an exposed portion, using a pulse signal phase-modulated based on a reference signal such that the exposed pattern formed on the surface of the roll-shaped member 401 is synchronized with rotation (for example, rotation of a spindle motor) of the rotation control section 402. As the reference signal, it is possible to use an output pulse from an encoder synchronized with rotation of the spindle motor.

For example, it is possible to control the pulse signal that is phase-modulated based on the reference signal synchronized with rotation as described below.

Figure 22A:
FIG. 22 contains explanatory diagrams to explain an example for setting a reference pulse signal and modulated pulse signal using, as a reference signal, an Z-phase signal of a spindle motor in the exposure apparatus according to this Embodiment.
Figure 22B:
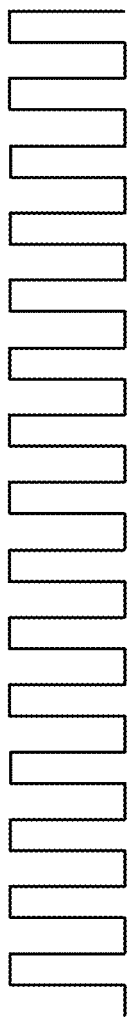
Figure 22C:
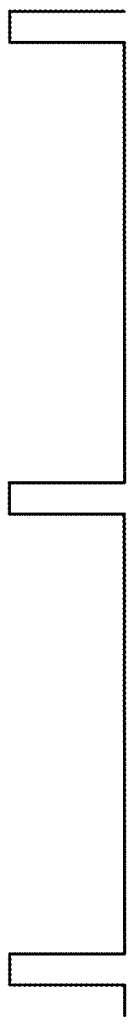

The relationship among a Z-phase signal of the spindle motor, reference pulse signal and modulated pulse signal will be described with reference to FIGS. 22A to 22C. Using the Z-phase signal as the reference, a pulse signal with the frequency m times (integer of m>2) that of the signal is a reference pulse signal, and a pulse signal with the frequency n times (integer of m/n>k and k>1) that of the signal is a modulated pulse signal. Each of the reference pulse signal and the modulated pulse signal is an integral multiple of the frequency of the Z-phase signal, and therefore, the integral pulse signal exists during the time the roll-shaped member 401 rotates once on the center axis.

Subsequently, the relationship among the reference pulse signal, modulated pulse signal and phase-modulated pulse signal will be described with reference to FIG. 23. When the phase of the reference pulse signal is increased or decreased periodically with the wavelength of the modulated pulse signal, the signal is the phase-modulated pulse signal. For example, when a reference pulse frequency fY0 is expressed by following equation (7) and a modulation frequency fYL is expressed by following equation (8), the frequency-modulated modulated pulse signal fY is expressed by following equation (9).

$$fY0 = A\sin(\omega 0 t + \Phi 0) \quad (7)$$

$$fYL = B\sin(\omega 1 t + \Phi 1) \quad (8)$$

$$fY = A\sin(\omega 0 t + \Phi 0 + C\sin(\omega 1 t)) \quad (9)$$

Further, as expressed by following equation (10), it is also possible to obtain a phase-modulated pulse signal fY' by adding a sine wave obtained from the modulated pulse signal to the reference pulse frequency fY0.

$$fY' = fY0 + C'\sin(t \cdot fYL/fY0 \times 2\pi) \quad (10)$$

Further, by adding a sine wave obtained from the wavelength LYL of the modulated pulse signal to the pulse wavelength LY0 of the reference pulse, it is possible to obtain the wavelength LY of the phase-modulated pulse signal.

Figure 23:
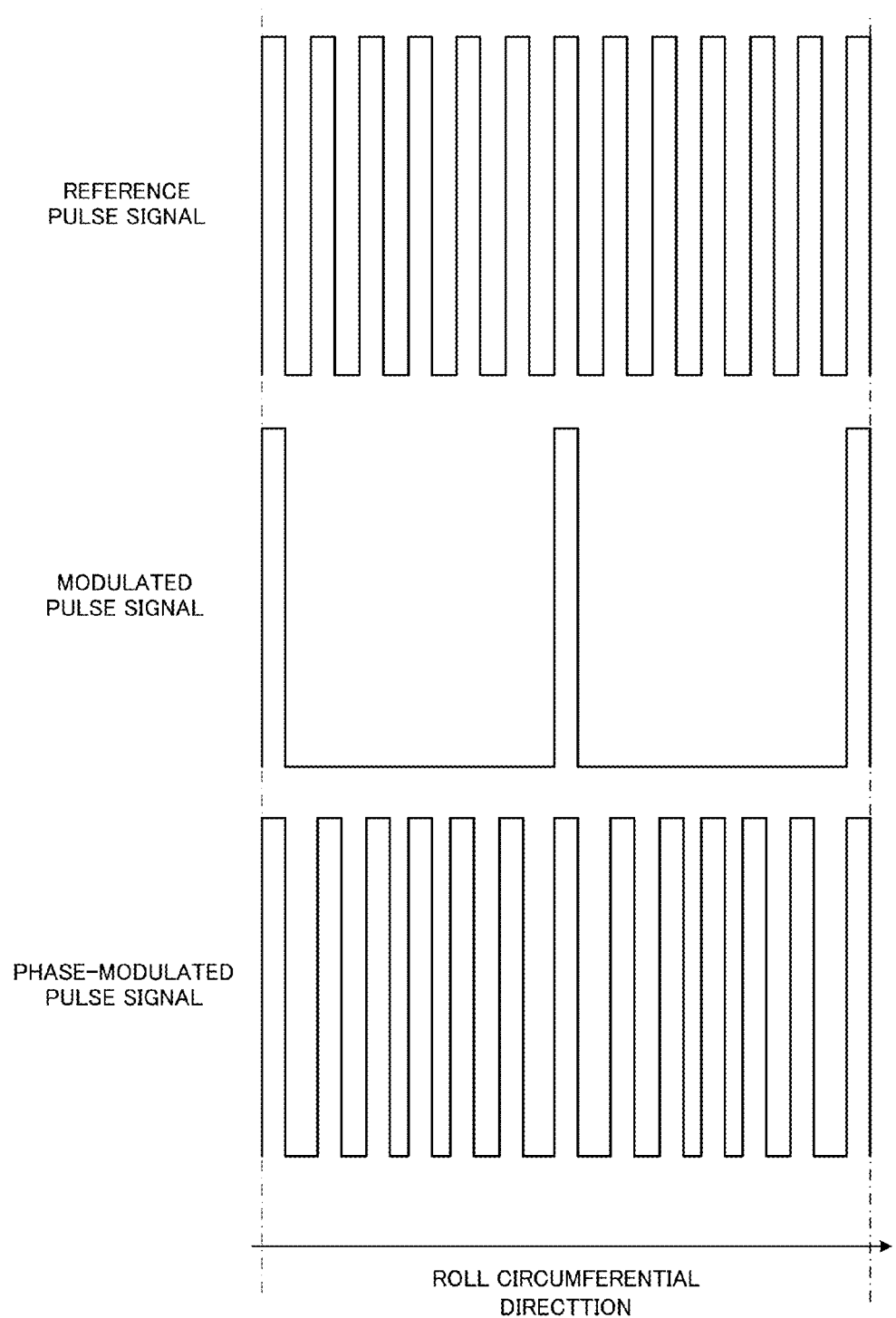
FIG. 23 is an explanatory diagram to explain an example for setting a phase-modulated pulse signal from the reference pulse signal and modulated pulse signal in the exposure apparatus according to this Embodiment.

As shown in FIG. 23, the obtained phase-modulated pulse signal is a signal such that the pulse interval of the reference pulse signal increases or decreases periodically corresponding to the signal interval of the modulated pulse signal.

Figure 24:
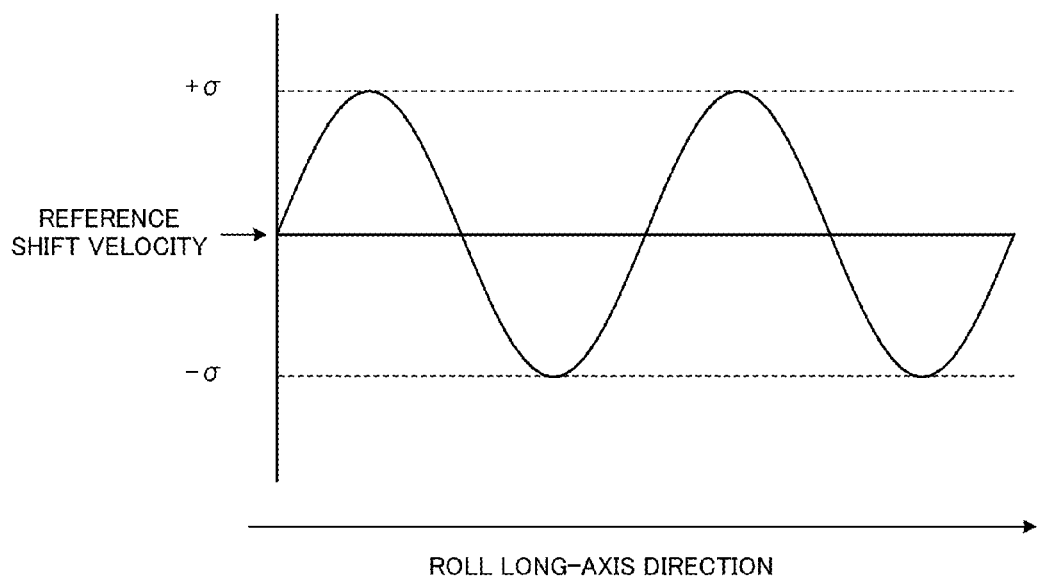
FIG. 24 is an explanatory view to explain an example of a shift velocity of a processing head portion to apply laser light in the exposure apparatus according to this Embodiment.

Further, in the exposure apparatus 400, it may be configured to control a pulse signal of laser exposure by the processing head portion 403 using a reference pulse signal with a certain frequency instead of the phase-modulated pulse signal, and to increase or decrease periodically the shift velocity of the processing head portion 403 by the shift mechanism section 404. In this case, for example, as shown in FIG. 24, the shift velocity of the processing head portion 403 is periodically increased or decreased. The shift velocity as shown in FIG. 24 is an example of the shift velocity of reference shift velocity ±σ. The shift velocity is preferably synchronized with rotation of the roll-shaped member 401, and for example, is controlled so that the velocity in the Z-phase signal is the velocity as shown in FIG. 24.

The above-mentioned description is of the case where the pattern 406 is controlled by periodical phase modulation, and it is also possible to form the pattern 406 by random phase modulation that is not periodical. For example, in the first direction D1, the pitch Py is inversely proportional to the pulse frequency. Therefore, when random frequency modulation is performed on the pulse frequency so that the maximum phase shift is 1/10, the pitch Py has a maximum variable δ1 that is 1/10 the pitch Py, and it is possible to obtain a pattern in which the pitch Py increases and decreases randomly.

For the control frequency of the reference signal synchronized with rotation, the modulated pulse signal may be controlled by the reference signal with a frequency of a plurality of times such as each one roll rotation, or may be controlled only by the initial reference signal set at the exposure initial time. In the case of controlling only by the initial reference signal, when modulation occurs in the number of revolutions of the rotation control section 402, phase modulation occurs in the exposure pulse signal. This is because of rotation control of nano-order, and therefore, even in a minute electrical potential variation of the rotation control section 402, a pitch variation of nano-order occurs and is accumulated. In the case of a pattern pitch with a pitch of 500 nm, when the roll outer circumferential length is 250 mm, laser exposure is performed 500,000 times, and only a deviation of 1 nm for every 10,000 times results in a deviation of 50 nm.

Figure 14:
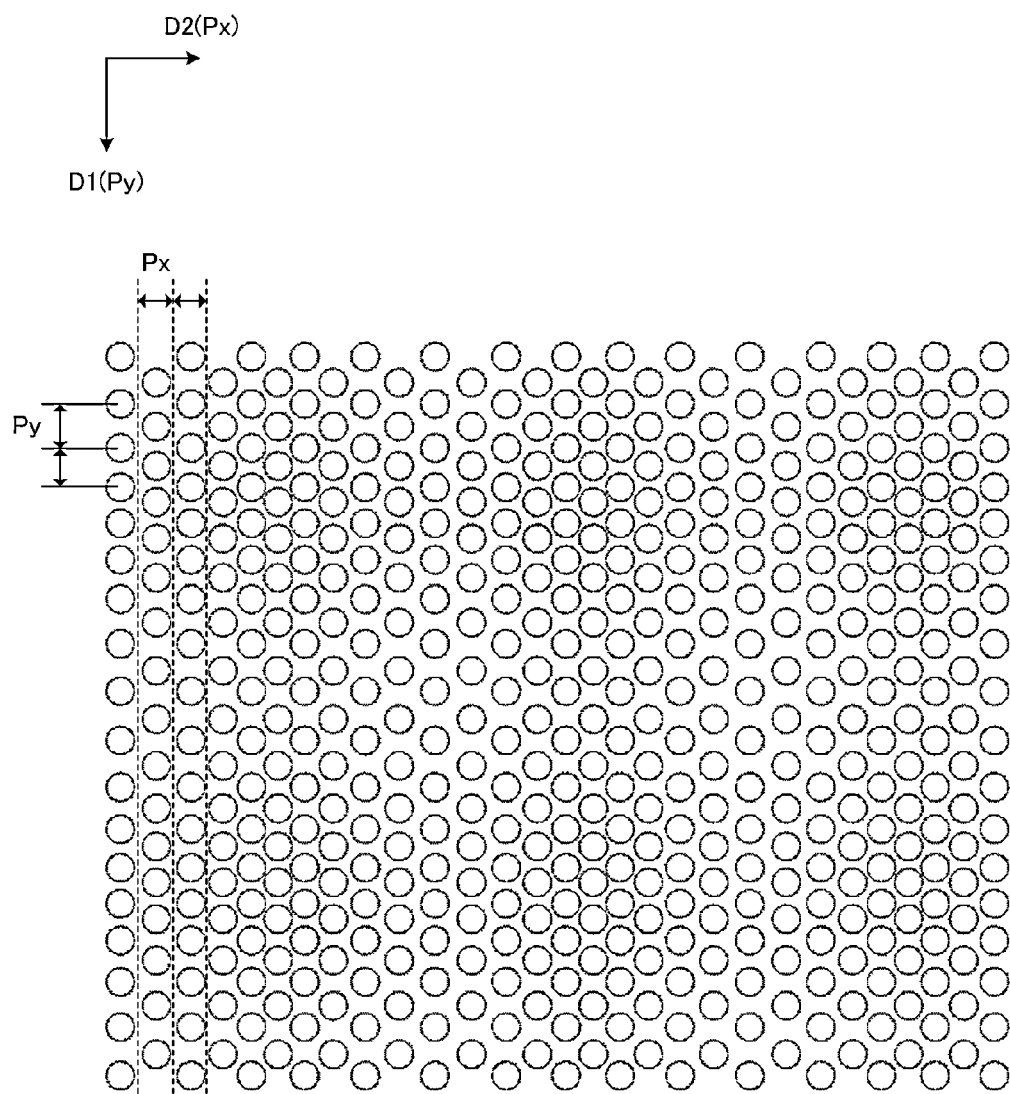
FIG. 14 is a schematic diagram showing still another example of the arrangement of a plurality of dots in the substrate for optics according to Embodiment 1.
Figure 15:
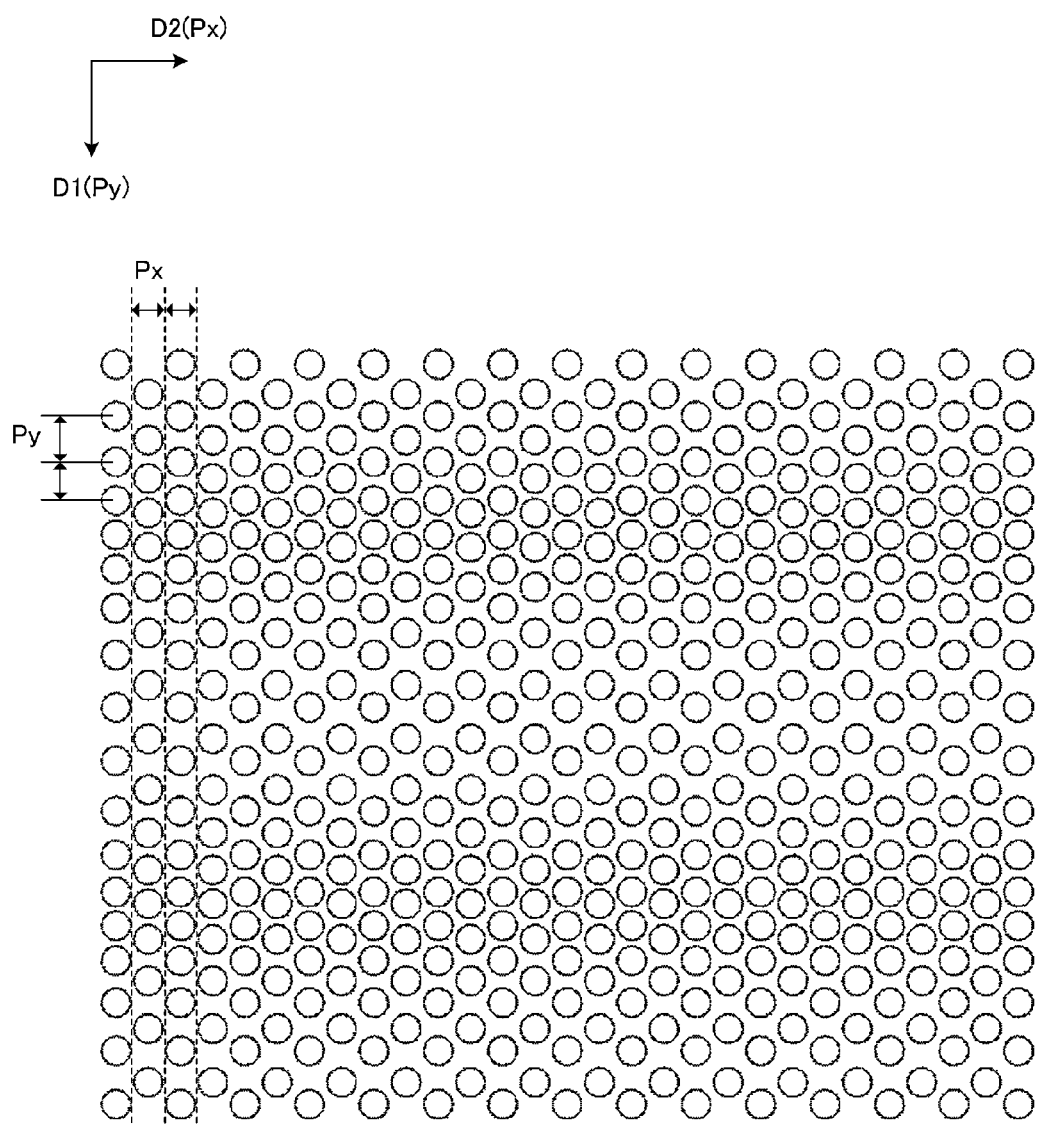
FIG. 15 is a schematic diagram showing still another example of the arrangement of a plurality of dots in the substrate for optics according to Embodiment 1.
Figure 16:
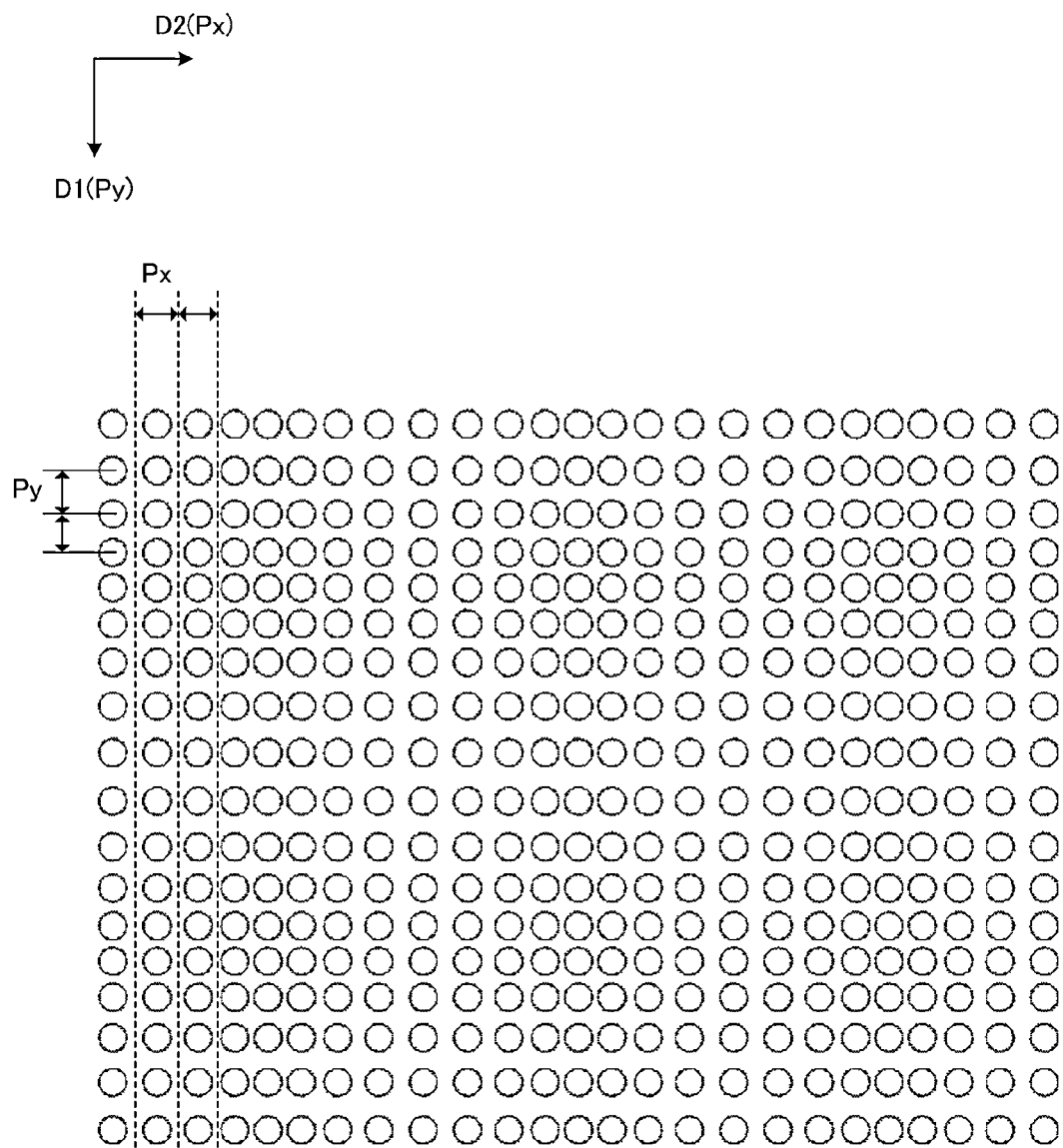
FIG. 16 is a schematic diagram showing still another example of the arrangement of a plurality of dots in the substrate for optics according to Embodiment 1.
Figure 17:
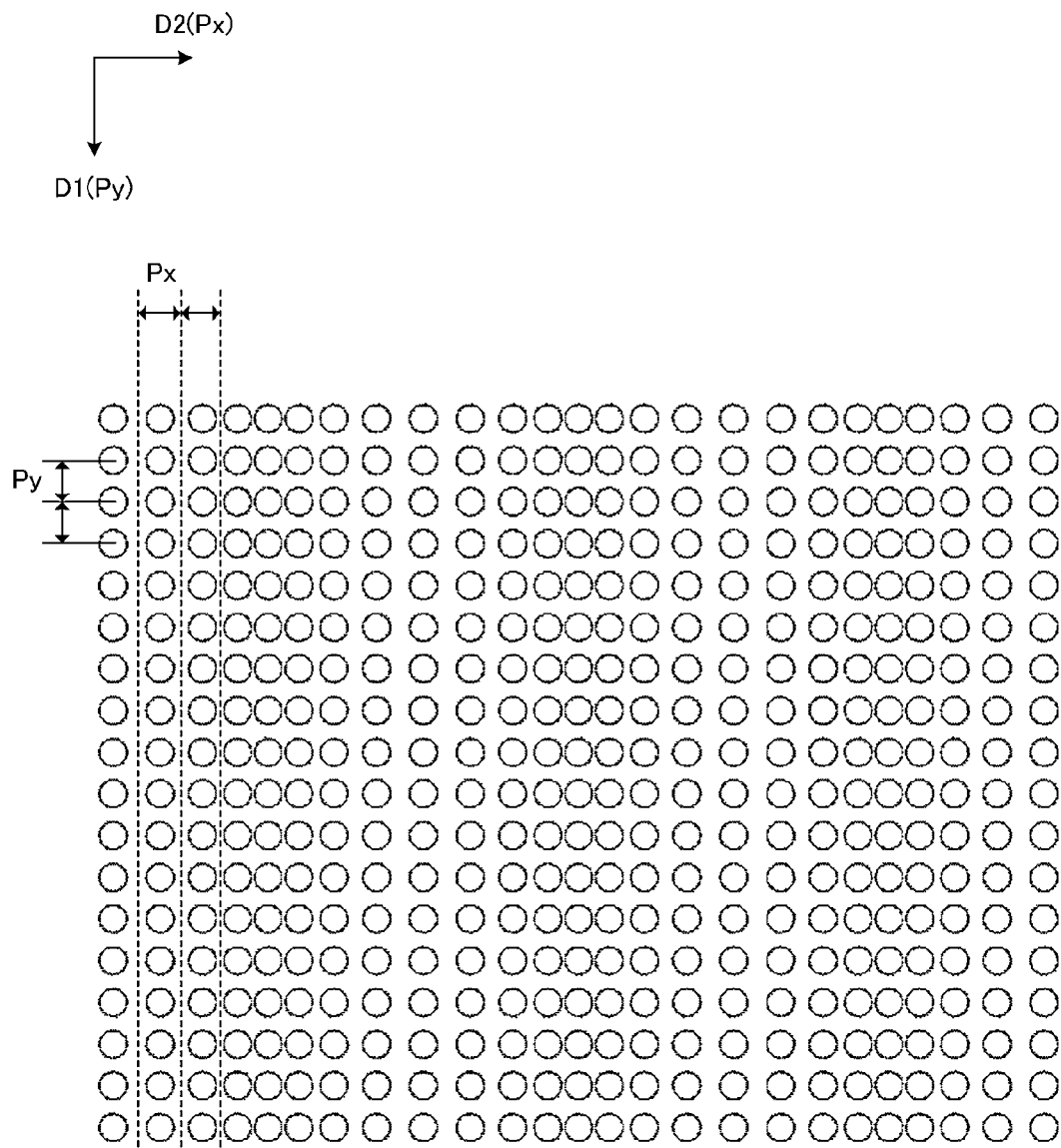
FIG. 17 is a schematic diagram showing still another example of the arrangement of a plurality of dots in the substrate for optics according to Embodiment 1.

Also in the same pitch and same long period, by adjusting the control frequency of the reference signal, it is possible to prepare the fine structure with the arrangement as shown in FIG. 12 or 14. In the case of forming the fine structure with the arrangement as shown in FIG. 12, the control frequency of the reference signal is decreased. Meanwhile, in the case of forming the fine structure with the arrangement as shown in FIG. 14, the control frequency of the reference signal is increased. Therefore, in the arrangement as shown in FIG. 14, the phases (positions) in the second direction D2 of corresponding dots are matched, and in the arrangement as shown in FIG. 12, deviations occur in the phases (positions) in the second direction D2 of corresponding dots. The relationship between the arrangements as shown in FIGS. 13 and 15 is the same.

Further, from the same reason, also when the pitch Py in the first direction D1 and the pitch Px in the second direction are equal to each other, as in the substrate for optics 60 according to Embodiment 2 as shown in FIG. 20, the shift amount $\alpha 1$ in the Y-axis direction between the first dot line 62-1 and the second dot line 62-2 adjacent to each other in the X-axis direction and the shift amount $\alpha 2$ between the second dot line 62-2 and the third dot line 62-3 adjacent to the second dot line 62-2 are provided to be different from each other, and a difference between the shift amount $\alpha 1$ and the shift amount $\alpha 2$ is not constant.

According to this configuration, pitches P1 to P3 among a plurality of dots 61 in the slanting direction in the main surface of the substrate itself are irregular, periodicity of the repetition pattern is thereby reduced, and the light scattering property due to the concavo-convex structure is more enhanced.

The roll-shaped member 401 with the resist layer provided on the surface exposed by the exposure apparatus 400 is developed, and the etching layer is etched by dry etching using the developed resist layer as a mask. After etching, by removing the residual resist layer, it is possible to obtain a roll-to-roll nano-imprint mold.

As a method of transferring the pattern 406 obtained as described above to a predetermined substrate and obtaining the substrate for optics according to this Embodiment, the method is not limited particularly. For example, a pattern is transferred to the surface of a predetermined substrate by the nano-imprint lithography method, the substrate is etched by dry etching using the transferred pattern portion as a mask, and it is thereby possible to transfer the pattern 406 to the substrate. More specifically, the roll-shaped member 401 with the pattern 406 formed is used as a cylindrical mold (roll-to-roll nano-imprint mold). A resist layer comprised of organic materials is formed on the surface side of the substrate, the cylindrical mold is pressed against the resist layer, the pattern 406 is transferred to the resist layer, then the resist layer and substrate are etched from the surface side to form the fine concavo-convex structure on the surface side of the substrate, and it is possible to obtain the substrate for optics of this Embodiment.

Further, instead of directly transferring the pattern 406 to the substrate from the cylindrical mold (roll-shaped member 401), there is another method of transferring the pattern 406 once to a film, forming a resin mold, then forming the pattern on a substrate by the nano-imprint lithography method using this resin mold, and obtaining the substrate for optics according to this Embodiment. According to this method, it is possible to increase usage efficiency of the mold, and to ignore the flatness of the substrate, and therefore, as the method of transferring the pattern to the substrate, the nano-imprint lithography method using the resin mold is more preferable.

The method of transferring the pattern 406 from the cylindrical mold to the resin mold is not limited particularly, and for example, it is possible to apply a direct nano-imprint method. As the direct nano-imprint method, there are a thermal nano-imprint method of filling the pattern 406 of the cylindrical mold with a thermosetting resin while heating at a predetermined temperature, cooling the cylindrical mold, and then, releasing the cured thermosetting resin to transfer, and a photo-nano-imprint method of irradiating a photocurable resin filled in the pattern 406 of the cylindrical mold with light of a predetermined wavelength, curing the photocurable resin, and then, releasing the cured photocurable resin from the cylindrical mold to transfer.

The cylindrical mold (roll-shaped member 401) is a seamless cylindrical mold, and therefore, is particularly suitable for successively transferring to resin molds by roll-to-roll nano-imprint.

Further, there is a method of preparing an electroforming mold from a resin mold with the pattern 406 transferred thereto by electroforming, and forming the pattern by the nano-imprint lithography method using this electroforming mold. In the case of forming an electroforming mold, such a case is preferable in terms of extending life of the cylindrical mold that is an original mold, and also in a scheme of once forming an electroforming mold, since it is possible to ignore the flatness of the substrate, a method of further forming a resin mold is preferable.

Furthermore, in the resin mold method, repetition transfer is easy, and the method is preferable. Herein, "repetition transfer" means either or both of (1) of manufacturing a plurality of concavo-convex pattern transfer materials inversely transferred from the resin mold (+) having the concavo-convex pattern, and (2) of, in the case of particularly using a curable resin composition as a transfer agent, obtaining a transfer material (−) inverted from the resin mold (+), next using the transfer material (−) as a resin mold (−) to obtain an inversely transferred transfer material (+) and performing repetition pattern inversion transfer of convexo-concave/concavo-convex/convexo-concave /concavo-convex/ . . . /.

After forming the pattern on the surface side of the substrate using the resist layer, concavities and convexities are formed on the substrate by etching using the resist layer as a mask. As the etching method, methods are not limited particularly, as long as the methods allow concavities and convexities to be formed on the substrate using the resist layer as a mask, and it is possible to apply wet etching, dry etching and the like. Particularly, since it is possible to deeply form concavities and convexities of the substrate, dry etching methods are preferable. Among the dry etching methods, anisotropic dry etching is preferable, and ICP-RIE and ECM-RIE are preferable. As a reactive gas used in dry etching, gases are not limited particularly, as long as the gases react with materials of the substrate. BCl3, Cl2, CHF3 or mixture gas thereof is preferable, and it is possible to mix Ar, O2 and the like as appropriate.

EXAMPLES

The present invention will specifically be described below based on Examples performed to clarify the effects of the invention. In addition, materials, use compositions, processing steps and the like in the Examples are illustrative, and are capable of being carried into practice with modifications thereof as appropriate. Moreover, it is possible to carry into practice with modifications as appropriate without departing from the scope of the invention. Therefore, the invention is not limited to the following Examples at all.

Example 1

Cylindrical Mold Preparation (Preparation of a Mold for Resin Mold Preparation)

Used as a substrate of a cylindrical mold was a cylindrical quartz glass roll with a diameter of 80 mm and a length of 50 mm. A fine structure (fine concavo-convex structure) was formed on the cylindrical quartz glass roll surface by a direct drawing lithography method using a semiconductor pulse laser by the following method.

First, a resist layer is deposited on the fine structure on the quartz glass surface by a sputtering method. The sputtering method was carried out with power of RF 100 W using CuO (including 8 atm % of Si) as a target (resist layer). The film thickness of the resist layer after deposition was 20 nm. The cylindrical mold prepared as described above was exposed on the following conditions while rotating at linear velocity s=1.0 m/sec.

Exposure semiconductor laser wavelength: 405 nm
Exposure laser power: 3.5 mW
X-axis direction pitch Px: 398 nm
Variable width δ2 with respect to the X-axis direction pitch Px: 80 nm
Long period PxL in the X-axis direction of the variable width δ2: 5 μm
Y-axis direction pitch Py: 460 nm
Variable width δ1 with respect to the Y-axis direction pitch Py: 100 nm
Long period PyL in the Y-axis direction of the variable width δ1: 5 μm The Y-axis direction pitch Py is determined as described below.

Time T required for one circumference is measured using a Z-phase signal of a spindle motor as a reference, a circumferential length L is calculated from the linear velocity s, and following equation (11) is obtained.

$$L = T \times s \quad (11)$$

Assuming a target pitch as Py, a value of 0.1% or less of the target pitch Py is added to adjust so that L/Py is an integer, and an effective pitch Py' is obtained by following equation (12).

$$L/Py' = m \text{ (}m\text{ is an integer)} \quad (12)$$

With respect to the target pitch Py and effective pitch Py', although strictly Py≠Py', since L/Py≈$10^7$, the equation of Py/Py'≈$10^{-7}$ holds, and it is possible to deal so that Py and Py' are substantially equal. Similarly, with respect to the long period PyL, an effective long period PyL' is obtained by following equation (13) so that L/PyL is an integer.

$$L/PyL' = n \text{ (}n\text{ is an integer)} \quad (13)$$

Also in this case, although strictly PyL≠PyL', since L/PyL≈$10^5$, the equation of PyL/PyL'≈$10^{-5}$ holds, and it is possible to deal so that PyL and PyL' are substantially equal.

Next, from the effective pitch Py', a reference pulse frequency fy0 and modulation frequency fYL are calculated by equations (14) and (15).

$$fy0 = s/Py' \quad (14)$$

$$fyL = s/PyL' \quad (15)$$

Finally, from equations (14) and (15), a pulse frequency fy at elapsed time t from the Z-phase signal of the spindle motor is determined as in equation (16).

$$fy = fy0 + \delta 1 \times \sin(tx(fyL/fy0) \times 2\pi) \quad (16)$$

An axis feed velocity in the X-axis direction is determined as described below.

The time T required for one circumference is measured using the Z-phase signal of the spindle motor as a reference, and a reference feed velocity Vx0 in the axis direction is determined from the X-axis direction pitch Px as in following equation (17).

$$Vx0 = Px/T \quad (17)$$

The axis feed velocity Vx at time t is determined from the long period PxL in the X-axis direction by following equation (18) and scanning is performed.

$$Vx = Vx0 + V\delta 2 \cdot \sin(Px/PxL \times t \times 2\pi) \quad (18)$$

Herein, Vδ2 is a velocity variable width in the long period PxL in the X-axis direction, and is expressed with the pitch variable width δ2 of the long period PxL, Px and Vx0 by following equation (19).

$$V\delta 2 = \delta 2 \times Vx0/Px \quad (19)$$

Next, the resist layer was developed. Development of the resist layer was carried out using 0.03 wt % of glycine aqueous solution on the condition of treatment time of 240 seconds. Next, using the developed resist layer as a mask, etching of the etching layer was performed by dry etching. Dry etching was carried out using $SF_6$ as an etching gas on the conditions of the treatment gas pressure of 1 Pa, treatment power of 300 W, and treatment time of 5 minutes. Next, only the residual resist layer was removed from the cylindrical mold provided with the fine structure on the surface on the condition of 6 minutes using hydrochloric acid of pH1 to prepare a cylindrical mold (mold for transfer).

(Preparation of a Resin Mold)

The obtained cylindrical quartz glass roll surface (mold for transfer) was coated with Durasurf HD-1101Z (made by Daikin Industries, Ltd.), heated at 60° C. for 1 hour, and then, allowed to stand at room temperature for 24 hours to fix. Then, cleaning was performed three times using Durasurf HD-ZV (made by Daikin Industries, Ltd.), and release treatment was performed.

Next, a reel-shaped resin mold was prepared from the obtained cylinder mold. OPTOOL DAC HP (made by Daikin Industries, Ltd.), trimethylolpropane triacrylate (made by TOAGOSEI Co., Ltd. M350), and Irgacure 184 (made by Ciba) were mixed in a ratio of 10:100:5 in parts by weight to prepare a photocurable resin. Next, the photocurable resin was coated on an easy adhesion surface of a PET film (A4100, made by Toyobo Co., Ltd.: width 300 mm, thickness 100 μm) by Micro Gravure coating (made by Yasui Seiki Co., Ltd.) so that the coating film thickness was 6 μm.

Next, the PET film coated with the photocurable resin was pressed against the cylinder mold (cylindrical mold) with a nip roll (0.1 MPa), and was irradiated with ultraviolet rays at a temperature of 25° C. and moisture of 60% under atmospheric pressure using a UV exposure apparatus (made by Fusion UV Systems Japan Co., Ltd., H bulb) so that the integral amount of exposure below the center of the lamp was 600 mJ/cm$^2$, photo-curing was carried out successively, and obtained was a reel-shaped transparent resin mold (length 200 m, width 300 mm) with the fine structure inversely transferred to the surface.

When the resin mold was observed with a scanning electron microscope, convex portions of cross-sectional shape with Φ400 nm and h800 nm were formed in periodical structure having the following long period structure.

X-axis direction pitch Px: 398 nm
   Variable width δ2 with respect to the X-axis direction pitch Px: 80 nm
   Long period PxL in the X-axis direction of the variable width δ2: 5 μm
Y-axis direction pitch Py: 460 nm
   Variable width δ1 with respect to the Y-axis direction pitch Py: 100 nm
   Long period PyL in the Y-axis direction of the variable width δ1: 5 μm (Electron Microscope)
Apparatus; HITACHI s-5500
Acceleration voltage; 10 kV
MODE; Normal (Preparation of an Inversed Resin Mold)

Next, OPTOOL DAC HP (made by Daikin Industries, Ltd.), trimethylolpropanetriacrylate (made by TOAGOSEI Co., Ltd. M350), and Irgacure 184 (made by Ciba) were mixed in a ratio of 10:100:5 in parts by weight to prepare a photocurable resin. The photocurable resin was coated on the easy adhesion surface of the PET film (A4100, made by Toyobo Co., Ltd.: width 300 mm, thickness 100 μm) by Micro Gravure coating (made by Yasui Seiki Co., Ltd.) so that the coating film thickness was 2 μm.

Next, the PET film coated with the photocurable resin was pressed against the above-mentioned reel-shaped resin mold with the nip roll (0.1 MPa), and was irradiated with ultraviolet rays at a temperature of 25° C. and moisture of 60% under atmospheric pressure using the UV exposure apparatus (made by Fusion UV Systems Japan Co., Ltd., H bulb) so that the integral amount of exposure below the center of the lamp was 600 mJ/cm$^2$, photo-curing was carried out successively, and obtained was a transparent resin mold sheet (length 200 mm, width 300 mm) with the fine structure inversely transferred to the surface.

(Nanoimprint Lithography)

Mask materials were applied onto a C-plane sapphire substrate with Φ2" thickness 0.33 mm by a spin coating method (2,000 rpm, 20 seconds) to form a resist layer. Prepared as the mask materials was a coating solution obtained by diluting with propylene glycol monomethyl ether so that the solid content of a photosensitive resin composition was 5 weight %.

(Photosensitive Resin Composition)

As the photosensitive resin composition, mixed and used were 20 parts by weight of 3-ethyl-3-{[3-ethyloxetane-3-yl)methoxy]methyl}oxetane (OXT-221, made by TOAGOSEI Co., Ltd.), 80 parts by weigh of 3',4'-epoxycyclohexane carboxylic acid 3,4-epoxycyclohexylmethyl (made by Wako Pure Chemical Industries Co., Ltd.), 50 parts by weight of phenoxy diethylene glycol acrylate (Aronix (Registered Trademark), M-101A, made by Toagosei Co., Ltd.), 50 parts by weight of ethylene oxide-modified bisphenol A diacrylate (Aronix (Registered Trademark), M-211B, made by Toagosei Co., Ltd.), 8 parts by weight of DTS-102 (made by Midori Kagaku Co., Ltd.), 1 part by weight of 1,9-dibutoxy anthracene (Anthracure (Registered Trademark) UVS-1331, made by Kawasaki Kasei Chemicals), 5 parts by weight of Irgacure (Registered Trademark) 184 (made by Ciba), and 4 parts by weight of OPTOOL (Registered Trademark) DAC HP (solid content of 20%, made by Daikin Industries, Ltd.).

The transparent resin mold sheet was cut in 70 mm×70 mm (□ 70 mm) and was laminated onto the sapphire substrate with the resist layer formed. For laminating, used was a sheet lamination machine (TMS-S2) made by Sun-Tec Co., Ltd. and lamination was performed with lamination nip force of 90 N and lamination velocity of 1.5 m/s. Next, laminated integrated transparent resin mold/resist layer/sapphire substrate was sandwiched between two transparent silicone plates (hardness 20) of □ 70 mm×t 10 mm. In this state, using a nano-imprint apparatus (EUN-4200) made by Engineering System Co., Ltd., the resultant was pressed with a pressure of 0.05 MPa. In the pressed state, ultraviolet rays were applied from the transparent resin mold side with 2,500 mJ/cm$^2$ to cure the resist layer. After curing, the transparent silicone plates and transparent resin mold were removed to obtain a resist/sapphire layered product with the pattern formed on the C-plane.

(Etching)

Using a reactive ion etching apparatus (RIE-101iPH, made by SAMCO Inc.), the sapphire was etched on the following etching conditions.

Etching gas: Cl2/(Cl2+BCl3)=0.1
Gas flow rate: 10 sccm
Etching pressure: 0.1 Pa
Antenna: 50 w
Bias: 50 w After etching, when the cross section of the sapphire substrate was observed with the electron microscope, convex portions of cross-sectional shape with Φ400 nm and h=250 nm were in periodical structure including the same long period structure as in the reel-shaped transparent resin mold used in nano-imprint.

(Formation of a Semiconductor Light Emitting Device)

On the obtained sapphire substrate, by MOCVD, layered successively were (1) an AlGaN low-temperature buffer layer, (2) an n-type GaN layer, (3) an n-type AlGaN clad layer, (4) an InGaN light emitting layer (MQW), (5) a p-type AlGaN clad layer, (6) a p-type GaN layer, and (7) an ITO layer. Concavities and convexities on the sapphire substrate were embedded in layering (2) the n-type GaN layer, and the flattened deposition condition was made. Further, etching treatment was performed, and electrode pads were attached.

In this state, using a probe, a current of 20 mA was passed between the p electrode pad and the n electrode pad, and light emission output was measured. Table 1 shows a light emission output ratio to Comparative Example 1.

Example 2

A cylindrical mold prepared as in Example 1 was exposed on the following conditions while rotating at linear velocity s=3.0 m/sec.

Exposure semiconductor laser wavelength: 405 nm
Exposure laser power: 3.5 mW
X-axis direction pitch Px: 173 nm
Variable width δ2 with respect to the X-axis direction pitch Px: 17 nm
Long period PxL in the X-axis direction of the variable width δ2: 5 μm
Y-axis direction pitch Py: 200 nm
Variable width δ1 with respect to the Y-axis direction pitch Py: 20 nm
Long period PyL in the Y-axis direction of the variable width δ6: 5 μm Thereafter, by the same operation as in Example 1, obtained was a reel-shaped transparent resin mold (length 200 m, width 300 mm) with the fine structure inversely transferred to the surface.

When the resin mold was observed with a scanning electron microscope, convex portions of cross-sectional shape with 0150 nm±15 nm and h260 nm±30 nm were formed in periodical structure having the following long period structure.

X-axis direction pitch Px: 173 nm
Variable width δ2 with respect to the X-axis direction pitch Px: 17 nm
Long period PxL in the X-axis direction of the variable width δ2: 5 μm
Y-axis direction pitch Py: 200 nm
Variable width δ1 with respect to the Y-axis direction pitch Py: 20 nm
Long period PyL in the Y-axis direction of the variable width δ1: 5 μm The maximum values of the dot diameter and dot height were observed in dots with the shortest dot distance from surrounding dots, the minimum values of the dot diameter and dot height were observed in dots with the widest dot distance from surrounding dots, and the dot diameters therebetween exhibited the same modulation curve as in modulation of the variable width of the distance between dots.

Thereafter, a semiconductor light emitting device was prepared as in Example 1, and light emission output was measured. Table 1 shows a light emission output ratio.

Example 3

A cylindrical mold prepared as in Example 1 was exposed on the following conditions while rotating at linear velocity s=1.0 m/sec.

Exposure semiconductor laser wavelength: 405 nm
Exposure laser power: 3.5 mW
X-axis direction pitch Px: 260 nm
Variable width δ2 with respect to the X-axis direction pitch Px: 26 nm
Long period PxL in the X-axis direction of the variable width δ2: 3.64 μm
Y-axis direction pitch Py: 300 nm
Variable width δ1 with respect to the Y-axis direction pitch Py: 30 nm
Long period PyL in the Y-axis direction of the variable width δ1: 4.2 μm Next, as in Example 1, obtained was a reel-shaped transparent resin mold (length 200 m, width 300 mm) with the surface structure inversely transferred.

Figure 25:
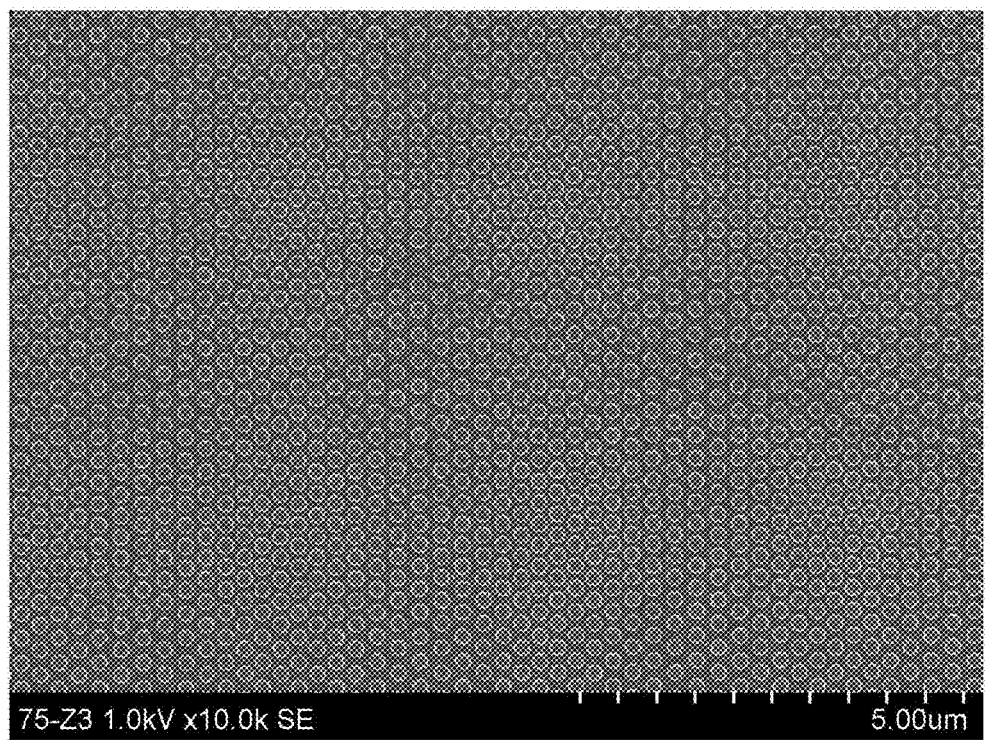
FIG. 25 is an electron microscope photograph of a concavo-convex structure of an Example of the substrate for optics according to this Embodiment.

Next, the surface of the prepared reel-shaped transparent resin mold was observed with the scanning electron microscope. The electron microscope photograph was shown in FIG. 25. FIG. 25 is the electron microscope photograph of the concavo-convex structure on a plan view. As can be seen from FIG. 25, in this fine structure, convex portions of nano-order were arranged at inconstant intervals both in the Y-axis direction (vertical direction) and X-axis direction (horizontal direction), and in each pitch, the above-mentioned pitches were repeated with the long period.

Thereafter, a semiconductor light emitting device was prepared as in Example 1, and light emission output was measured. Table 1 shows a light emission output ratio.

Example 4

A cylindrical mold prepared as in Example 1 was exposed on the following conditions while rotating at linear velocity s=1.0 m/sec.

Exposure semiconductor laser wavelength: 405 nm
Exposure laser power: 3.5 mW

X-axis direction pitch Px: 200 nm
Y-axis direction pitch Py: 200 nm

Control of the reference signal of the pitch Py was made only initially.

Next, as in Example 1, obtained was a reel-shaped transparent resin mold (length 200 m, width 300 mm) with the surface structure inversely transferred.

Figure 26:
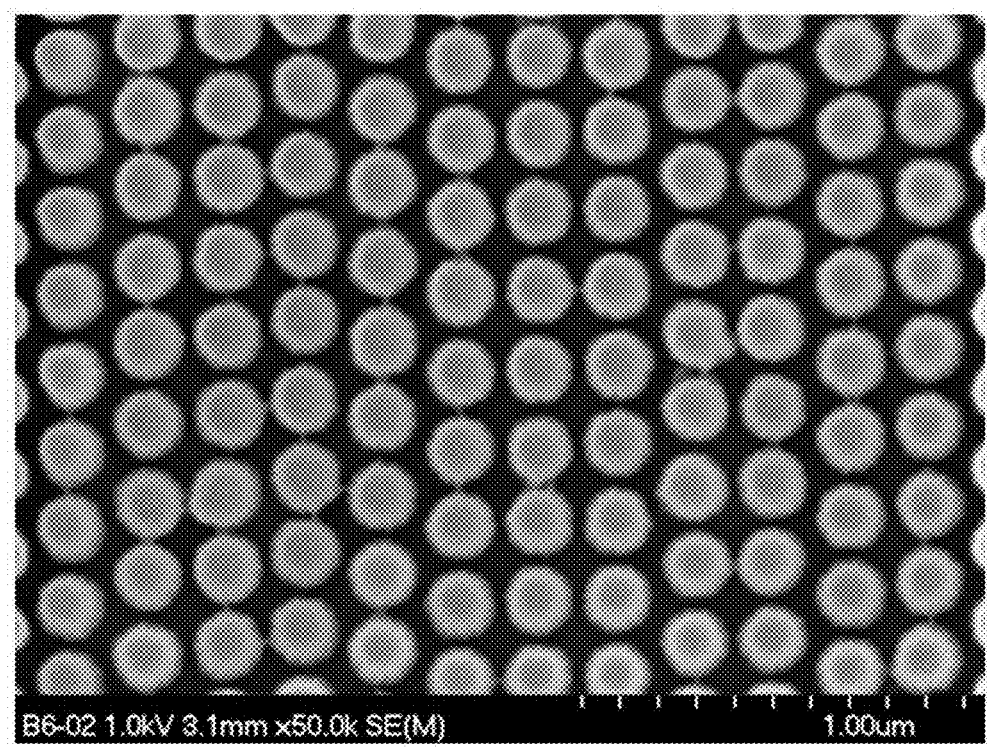
FIG. 26 is an electron microscope photograph of a concavo-convex structure of another Example of the substrate for optics according to this Embodiment.

Next, the surface of the prepared reel-shaped transparent resin mold was observed with the scanning electron microscope. FIG. 26 shows the electron microscope photograph. As can be seen from FIG. 26, in this fine structure, convex portions were arranged in the shape of lines with the set pitch Py in the Y-axis direction (vertical direction). Further, it is understood that the line-shaped convex portions were repeatedly provided with the predetermined pitch Px in the X-axis direction (horizontal direction). Further, it is understood that the shift amounts a were irregular among line-shaped convex portions arranged adjacent to one another in the X-axis direction.

X-axis direction pitch Px: 200 nm
Y-axis direction pitch Py: 200 nm

Thereafter, a semiconductor light emitting device was prepared as in Example 1, and light emission output was measured. Table 1 shows a light emission output ratio.

Example 5

In preparation of a cylindrical mold, random signals were superimposed on the light emission frequency of the exposure semiconductor laser, and the pitch Py in the Y-axis direction was provided with a variable width δ as described below.

Y-axis direction pitch Py: 200 nm±10 nm

Thereafter, a semiconductor light emitting device was prepared as in Example 1, and light emission output was measured. Table 1 shows a light emission output ratio.

Example 6

A SiC substrate (substrate for optics) and semiconductor light emitting device were prepared as in Example 4 except that the substrate was SiC, and light emission output was measured. Table 1 shows a light emission output ratio.

Example 7

As in Example 1, obtained was a transparent resin mold sheet (length 200 m, width 300 mm) with the fine structure inversely transferred to the surface.
(Formation of a Layered Semiconductor Layer)

On a C-plane sapphire substrate with Φ2" thickness 0.37 mm, by MOCVD, by successively layering (1) an AlGaN low-temperature buffer layer, (2) an n-type GaN layer, (3) an n-type AlGaN clad layer, (4) an InGaN light emitting layer (MQW), (5) a p-type AlGaN clad layer, and (6) a p-type GaN layer, a layered semiconductor layer was formed.
(Nano-Imprint Lithography)

Mask materials were applied onto (6) the p-type GaN layer of the uppermost surface of the obtained layered semiconductor layer by the spin coating method (2,000 rpm, 20 seconds) to form a resist layer. Prepared as the mask materials was a coating solution obtained by diluting with propylene glycol monomethyl ether so that the solid content of a photosensitive resin composition was 5 weight %. As the photosensitive resin composition, the same composition as in Example 1 was used.

The transparent resin mold sheet was cut in 70 mm×70 mm (□ 70 mm) and was laminated onto the GaN surface with the resist layer formed. For laminating, used was the sheet lamination machine (TMS-S2) made by Sun-Tec Co., Ltd. and lamination was performed with lamination nip force of 90 N and lamination velocity of 1.5 m/s. Next, laminated integrated transparent resin mold/resist layer/GaN layer/sapphire substrate was sandwiched between two transparent silicone plates (hardness 20) of □ 70 mm×t 10 mm. In this state, using the nano-imprint apparatus (EUN-4200) made by Engineering System Co., Ltd., the resultant was pressed with a pressure of 0.05 MPa. In the pressed state, ultraviolet rays were applied from the transparent resin mold side with 2,500 mJ/cm² to cure the resist layer. After curing, the transparent silicone plates and transparent resin mold were removed to obtain a resist/GaN/sapphire layered product with the pattern formed on the C-plane.
(Etching)

Using the reactive ion etching apparatus (RIE-1011PH, made by SAMCO Inc.), the GaN semiconductor layer was etched on the following etching conditions.

Etching gas: Cl2/(Cl2+BCl3)=0.1
Gas flow rate: 10 sccm
Etching pressure: 0.1 Pa
Antenna: 50 w
Bias: 50 w After etching, when observation with the electron microscope was performed on the GaN surface, convex portions of cross-sectional shape with Φ400 nm and h=50 nm were in periodical structure including the same long period structure as in the reel-shaped transparent resin mold used in nano-imprint.
(Formation of a Semiconductor Light Emitting Device)

An ITO layer was further formed on the GaN surface of the layered semiconductor layer surface with the concavo-convex pattern formed by sputtering as a transparent conductive film. Further, etching treatment was performed and electrode pads were attached.

In this state, using the probe, a current of 20 mA was passed between the p electrode pad and the n electrode pad, and light emission output was measured. Table 1 shows a light emission output ratio of this Example 7 to Comparative Example 1 described below.

Example 8

As in Example 1, obtained was a transparent resin mold sheet (length 200 m, width 300 mm) with the fine structure inversely transferred to the surface.
(Formation of a Layered Semiconductor Layer)

On a C-plane sapphire substrate with Φ2" thickness 0.37 mm, by MOCVD, by successively layering (1) an AlGaN low-temperature buffer layer, (2) an n-type GaN layer, (3) an n-type AlGaN clad layer, (4) an InGaN light emitting layer (MQW), (5) a p-type AlGaN clad layer, (6) a p-type GaN layer and (7) an ITO layer, a layered semiconductor layer was formed.
(Nanoimprint Lithography)

Mask materials were applied onto (7) the ITO layer of the uppermost surface of the obtained layered semiconductor layer by the spin coating method (2,000 rpm, 20 seconds) to form a resist layer. Prepared as the mask materials was a coating solution obtained by diluting with propylene glycol monomethyl ether so that the solid content of a photosensitive resin composition was 5 weight %. The photosensitive resin composition was of the same composition as in Example 1.

The transparent resin mold sheet was cut in 70 mm×70 mm (□ 70 mm) and was laminated onto the ITO surface with the resist layer formed. For laminating, used was the sheet lamination machine (TMS-S2) made by Sun-Tec Co., Ltd. and lamination was performed with lamination nip force of 90 N and lamination velocity of 1.5 m/s. Next, laminated integrated transparent resin mold/resist layer/ITO layer/GaN layer/sapphire substrate was sandwiched between two transparent silicone plates (hardness 20) of □ 70 mm×t 10 mm. In this state, using the nanoimprint apparatus (EUN-4200) made by Engineering System Co., Ltd., the resultant was pressed with a pressure of 0.05 MPa. In the pressed state, ultraviolet rays were applied from the transparent resin mold side with 2,500 mJ/cm$^2$ to cure the resist layer. After curing, the transparent silicone plates and transparent resin mold were removed to obtain a resist/ITO/GaN/sapphire layered product with the pattern formed on the C-plane.

(Etching)

Using the reactive ion etching apparatus (RIE-101IPH, made by SAMCO Inc.), the ITO layer was etched on the following etching conditions.

Etching gas: Cl2/(Cl2+BCl3)=0.1
Gas flow rate: 10 sccm
Etching pressure: 0.1 Pa
Antenna: 50 w
Bias: 50 w After etching, when observation with the electron microscope was performed on the ITO surface, convex portions of cross-sectional shape with Φ400 nm and h=50 nm were in periodical structure including the same long period structure as in the reel-shaped transparent resin mold used in nanoimprint.

(Formation of a Semiconductor Light Emitting Device)

Etching treatment was further performed on the ITO surface of the layered semiconductor layer surface with the concavo-convex pattern formed, and electrode pads were attached.

In this state, using the probe, a current of 20 mA was passed between the p electrode pad and the n electrode pad, and light emission output was measured. Table 1 shows a light emission output ratio of this Example 8 to Comparative Example 1 described below.

Comparative Example 1

Semiconductor light emitting layers were formed on a normal flat sapphire substrate on the same conditions as in Example 1, and light emission output was measured by the same method as in Example 1.

Comparative Example 2

A concavo-convex structure of hexagonal arrangement with a diameter of 3 μm, pitch of 6 μm and height of 2 μm was provided on a sapphire substrate by a normal photolithography method. Thereafter, semiconductor light emitting layers were formed on the same conditions as in Example 1, and light emission output was measured by the same method as in Example 1.

Comparative Example 3

By the same method as in Example 1, a fine structure (fine concavo-convex structure) of nano-pattern was formed on a quartz glass surface by the direct drawing lithography method using the semiconductor laser. Pitches in the X-axis direction and the Y-axis direction were the same, and a hexagonal arrangement without pitch variations was made.

X-direction pitch Px: 398 nm
Y-direction pitch Py: 460 nm

Thereafter, by the same methods as in Example 1, semiconductor light emitting layers were formed, and light emission output was measured.

Comparative Example 4

A fine structure (fine concavo-convex structure) of nano-pattern was formed on a quartz glass surface by the direct drawing lithography method using the semiconductor laser. Pitches in the X-axis direction and the Y-axis direction were the same, and a hexagonal arrangement without pitch variations was made.

X-direction pitch Px: 200 nm
Y-direction pitch Py: 200 nm

As in Example 1 except the aforementioned respect, a sapphire substrate (substrate for optics) and semiconductor light emitting device were prepared, and light emission output was measured. Table 1 shows the result.

Comparative Example 5

A concavo-convex structure of hexagonal arrangement with a diameter of 3 μm, pitch of 6 μm and height of 50 nm was provided on a p-type GaN layer on a sapphire substrate by the normal photolithography method. Thereafter, a semiconductor light emitting device was formed on the same conditions as in Example 7, and light emission output was measured by the same method as in Example 7.

Comparative Example 6

A concavo-convex structure of hexagonal arrangement with a diameter of 3 μm, pitch of 6 μm and height of 50 nm was provided on the layered semiconductor layer used in Example 8 by the normal photolithography method. Thereafter, a semiconductor light emitting device was prepared on the same conditions as in Example 8, and light emission output was measured by the same method as in Example 8.

Table 1 shows light emission ratios with output of Comparative Example being "1". From Table 1, it is understood that according to the substrates for optics (Examples 1 to 6) according to this Embodiment, as compared with the conventional flat sapphire substrate (Comparative Example 1), the sapphire substrate having concavities and convexities of μ-order (Comparative Example 2), and the sapphire substrate having concavities and convexities of nano-order without pitch variations (Comparative Example 3), it is possible to decrease the number of dislocation defects in the semiconductor layers formed on the sapphire substrate, it is further possible to resolve the waveguide mode due to light scattering caused by the concavo-convex pattern with periodicity disturbed and to increase light extraction efficiency, and that it is thereby possible to obtain semiconductor light emitting devices having high luminous efficiency.

Further, from Table 1, it is understood that according to the semiconductor light emitting devices (Examples 7 and 8) according to this Embodiment, as compared with the conventional flat uppermost layer (Comparative Example 1), the GaN uppermost layer having concavities and convexities of micro-order (Comparative Example 4), and the ITO uppermost layer having concavities and convexities of micro-order (Comparative Example 5), it is possible to reduce contact resistance with the transparent conductive film and p electrode pad, to resolve the waveguide mode due to light scattering caused by the concavo-convex pattern with periodicity disturbed and to increase light extraction efficiency, and that high luminous efficiency is thereby provided.

TABLE 1

|  | Light emission output ratio |
|---|---|
| Example 1 | 1.80 |
| Example 2 | 2.50 |
| Example 3 | 2.90 |
| Example 4 | 1.70 |
| Example 5 | 1.60 |
| Example 6 | 2.80 |
| Example 7 | 2.70 |
| Example 8 | 1.80 |
| Comparative Example 1 | 1.00 |
| Comparative Example 2 | 1.35 |
| Comparative Example 3 | 1.40 |
| Comparative Example 4 | 1.05 |
| Comparative Example 5 | 1.41 |
| Comparative Example 6 | 1.20 |

In addition, the present invention is not limited to the above-mentioned Embodiments, and is capable of being carried into practice with various modifications thereof. In the above-mentioned Embodiments, the size, shape and the like shown in the accompanying drawings are not limited thereto, and are capable of being modified as appropriate within the scope of exhibiting the effects of the invention. Moreover, the invention is capable of being carried into practice with modifications thereof as appropriate without departing from the scope of the invention.

Industrial Applicability

According to the present invention, by the fine-structure layer provided in the substrate for optics and the semiconductor light emitting device, by improving internal quantum efficiency IQE by decreasing the number of dislocation defects in the semiconductor layer, or enhancing ohmic contact of the p-type semiconductor layer to improve electron injection efficiency EIE, and resolving the waveguide mode by light scattering to increase light extraction efficiency LEE, it is possible to enhance luminous efficiency of the LED. Accordingly, the substrate for optics and semiconductor light emitting device of the invention have high luminous efficiency, thereby permit effective practical use of electric power, and are capable of significantly contributing to energy saving.

The present application is based on Japanese Patent Application Nos. 2011-188803 and 2011-188804 filed on Aug. 31, 2011, Japanese Patent Application No. 2011-229121 filed on Oct. 18, 2011, Japanese Patent Application Nos. 2012-27548, 2012-27549 and 2012-27550 filed on Feb. 10, 2012, and Japanese Patent Application No. 2012-89230 filed on Apr. 10, 2012, entire contents of which are expressly incorporated by reference herein.

The invention claimed is:

1. A substrate for optics comprising a fine-structure layer including dots comprised of a plurality of convex portions or concave portions extending in a direction of from a main surface of a substrate to outside the surface,
   wherein the fine-structure layer forms a plurality of linear dot lines in which the plurality of dots is arranged with a pitch Py in a first direction in the main surface of the substrate and centers of the plurality of dots are on a straight line in the first direction,
   while the plurality of linear dot lines form a plurality of dot lines arranged with a pitch Px in a second direction orthogonal to the first direction in the main surface of the substrate, and
   one of the pitch Py and the pitch Px is a constant interval of nano-order, while the other one is an inconstant interval of nano-order, or both are inconstant intervals of nano-order.

2. The substrate for optics according to claim 1, wherein the inconstant interval of nano-order has a variable width δ, the variable width δ is in the range of 1% to 50% of an average pitch of the pitch Py, and the variable width δ is in the range of 1% to 50% of an average pitch of the pitch Px.

3. The substrate for optics according to claim 1, wherein the pitch Py with the inconstant interval is equal to a distance between centers of respective dots, the pitch Px with the inconstant interval is equal to a distance among a plurality of dot lines that the plurality of dots is arranged with the pitch Py, the pitch Py and the pitch Px are larger than a diameter of each dot,
   pitches Pyn among at least four or more and m or less of adjacent dots ($3 \leq n \leq 2a$ or $3 \leq n \leq 2a+1$ wherein, m and a are positive integers and n=m−1) meet a relationship of following equation (1) while at least one or more dot groups formed with the pitches Py1 to Pyn are arranged in the first direction when the pitch Py is the inconstant interval
   and when the pitch Px is the inconstant interval, pitches Pxn among at least four or more and m or less of adjacent dots ($3 \leq n \leq 2a$ or $3 \leq n \leq 2a+1$ wherein, m and a are positive integers and n=m−1) meet a relationship of following equation (2) while at least one or more dot line groups formed with the pitches Px1 to Pxn are arranged in the second direction $$Py1<Py2<Py3<\ldots<Pya>\ldots>Pyn \qquad (1)$$

$$Px1<Px2<Px3<\ldots<Pxa>\ldots>Pxn \qquad (2).$$

4. The substrate for optics according to claim 1, wherein the pitch Py with the inconstant interval is equal to a distance between centers of respective dots, the pitch Px with the inconstant interval is equal to a distance among a plurality of dot lines that the plurality of dots is arranged with the pitch Py, the pitch Py and the pitch Px are larger than a diameter of each dot,
   pitches Pyn among at least four or more and m or less of adjacent dots ($3 \leq n \leq 2a$ or $3 \leq n \leq 2a+1$ wherein, m and a are positive integers and n=m−1) meet a relationship of following equation (1) while dot groups formed with the pitches Py1 to Pyn are in a configuration in which a long-period unit Lyz is repeatedly arranged in the first direction when the pitch Py is the inconstant interval,
   and when the pitch Px is the inconstant interval, pitches Pxn among at least four or more and m or less of adjacent dots ($3 \leq n \leq 2a$ or $3 \leq n \leq 2a+1$ wherein, m and a are positive integers and n=m−1) meet a relationship of following equation (2) while dot line groups formed with the pitches Px1 to Pxn are in a configuration in which a long-period unit Lxz is repeatedly arranged in the second direction $$Py1<Py2<Py3<\ldots<Pya>\ldots>Pyn \qquad (1)$$

$$Px1<Px2<Px3<\ldots<Pxa>\ldots>Pxn \qquad (2).$$

5. The substrate for optics according to claim 3, wherein the diameter of each of the dots increases or decreases corresponding to the pitch Py and/or the pitch Px,
   dot diameters Dyn of at least four or more and m or less of adjacent dots ($3 \leq n \leq 2a$ or $3 \leq n \leq 2a+1$ wherein, m and a are positive integers and n=m−1) forming the pitch meet a relationship of following equation (3) while at least one or more dot groups formed with the dot diameters Dy1 to Dyn are arranged in the first direction when the pitch Py is the inconstant interval, and when the pitch Px is the inconstant interval, dot diameters Dxn of at least four or more and m or less of adjacent dots (3≤n≤2a or 3n≤2a+1 wherein, m and a are positive integers and n=m−1) forming the pitch meet a relationship of following equation (4) while at least one or more dot groups formed with the dot diameters Dx1 to Dxn are arranged in the second direction $$Dy1<Dy2<Dy3<\ldots<Dya>\ldots>Dyn \quad (3)$$

$$Dx1<Dx2<Dx3<\ldots<Dxa>\ldots>Dxn \quad (4).$$

6. The substrate for optics according to claim 4, wherein the diameter of each of the dots increases or decreases corresponding to the pitch Py and/or the pitch Px, dot diameters Dyn of at least four or more and m or less of adjacent dots (3≤n≤2a or 3≤n≤2a+1 wherein, m and a are positive integers and n=m−1) forming the pitch meet a relationship of following equation (3) while dot groups formed with the dot diameters Dy1 to Dyn are repeatedly arranged in a long-period unit Lyz in the first direction when the pitch Py is the inconstant interval, and when the pitch Px is the inconstant interval, dot diameters Dxn of at least four or more and m or less of adjacent dots (3≤n≤2a or 3≤n≤2a+1 wherein, m and a are positive integers and n=m−1) forming the pitch meet a relationship of following equation (4) while dot groups formed with the dot diameters Dx1 to Dxn are repeatedly arranged in a long-period unit Lxz in the second direction $$Dy1<Dy2<Dy3<\ldots<Dya>\ldots>Dyn \quad (3)$$

$$Dx1<Dx2<Dx3<\ldots<Dxa>\ldots>Dxn \quad (4).$$

7. The substrate for optics according to claim 5, wherein a height of each of the dots increases or decreases corresponding to the pitch Py and/or the pitch Px, dot heights Hyn of at least four or more and m or less of adjacent dots (3 ≤n≤2a 3≤n≤2a+1 wherein, m and a are positive integers and n=m−1) forming the pitch meet a relationship of following equation (5) while at least one or more dot groups formed with the dot heights Hy1 to Hyn are arranged in the first direction when the pitch Py is the inconstant interval, and when the pitch Px is the inconstant interval, dot heights Hxn of at least four or more and m or less of adjacent dots (3≤n≤2a or 3≤n≤2a+1 wherein, m and a are positive integers and n=m−1) forming the pitch meet a relationship of following equation (6) while at least one or more dot groups formed with the dot heights Hx1 to Hxn are arranged in the second direction $$Hy1<Hy2<Hy3<\ldots<Hya>\ldots>Hyn \quad (5)$$

$$Hx1<Hx2<Hx3<\ldots<Hxa>\ldots>Hxn \quad (6).$$

8. The substrate for optics according to claim 6, wherein a height of each of the dots increases or decreases corresponding to the pitch Py and/or the pitch Px, dot heights Hyn of at least four or more and m or less of adjacent dots (3≤n≤2a or 3≤n≤2a+1 wherein, m and a are positive integers and n=m−1) forming the pitch meet a relationship of following equation (5) while dot groups formed with the dot heights Hy1 to Hyn are repeatedly arranged in a long-period unit Lyz in the first direction when the pitch Py is the inconstant interval, and when the pitch Px is the inconstant interval, dot heights Hxn of at least four or more and m or less of adjacent dots (3≤n≤2a or 3≤n≤2a+1 wherein, m and a are positive integers and n=m−1) forming the pitch meet a relationship of following equation (6) while dot groups formed with the dot heights Hx1 to Hxn are repeatedly arranged in a long-period unit Lxz in the second direction $$Hy1<Hy2<Hy3<\ldots<Hya>\ldots>Hyn \quad (5)$$

$$Hx1<Hx2<Hx3<\ldots<Hxa>\ldots>Hxn \quad (6).$$

9. A semiconductor light emitting device including at least one or more substrates for optic according to claim 1 in a configuration.

10. A mold for imprint to manufacture the substrate for optics according to claim 1 by transfer forming, having a shape fitted into dots disposed on the main surface of the substrate for optics.

* * * * *